US010511218B2

(12) United States Patent
Kondo

(10) Patent No.: US 10,511,218 B2
(45) Date of Patent: Dec. 17, 2019

(54) GATE DRIVE CIRCUIT, THAT SUPPLIES POWER TO A GATE OF A SEMICONDUCTOR SWITCHING ELEMENT, AND CARRIES OUT A DRIVING ON AND OFF OF THE GATE

(71) Applicant: Mitsubishi Electric Corporation, Chiyoda-ku (JP)

(72) Inventor: Ryota Kondo, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/776,133

(22) PCT Filed: Sep. 12, 2016

(86) PCT No.: PCT/JP2016/076761
§ 371 (c)(1),
(2) Date: May 15, 2018

(87) PCT Pub. No.: WO2017/110162
PCT Pub. Date: Jun. 29, 2017

(65) Prior Publication Data
US 2018/0331613 A1 Nov. 15, 2018

(30) Foreign Application Priority Data
Dec. 22, 2015 (JP) ................. 2015-249464

(51) Int. Cl.
*H03K 17/687* (2006.01)
*H02M 1/08* (2006.01)
(Continued)

(52) U.S. Cl.
CPC ............ *H02M 1/08* (2013.01); *H03K 17/687* (2013.01); *H02M 3/1588* (2013.01);
(Continued)

(58) Field of Classification Search
CPC ....... H03K 17/161–163; H03K 17/687; H03K 2017/6876; H03K 17/60; H03K 17/602
(Continued)

(56) References Cited

U.S. PATENT DOCUMENTS 5,148,048 A * 9/1992 Kawasaki ............ H03K 17/163
326/26
7,285,876 B1 * 10/2007 Jacobson .............. H02M 1/088
307/127
(Continued)

FOREIGN PATENT DOCUMENTS

JP 2005-039988 A 2/2005
JP 2007-505544 A 3/2007

OTHER PUBLICATIONS

International Search Report dated Oct. 11, 2016 in PCT/JP2016/076761, filed on Sep. 12, 2016.

*Primary Examiner* — Gary L Laxton
*Assistant Examiner* — Peter M Novak
(74) *Attorney, Agent, or Firm* — Oblon, McClelland, Maier & Neustadt, L.L.P.

(57) ABSTRACT

A gate drive circuit including a drive-on element that applies an on-state voltage to a gate of a drive target semiconductor element and a drive-off element that applies an off-state voltage to the gate is such that a recovery switch, a reactor, and a capacitor are connected in series between output terminals of the gate drive circuit as a recovery circuit that can recover a charge accumulated in input capacitance of the drive target semiconductor element when turning on, and the drive-on element, the drive-off element, and the recovery switch are controlled by a control circuit, whereby power consumption of the gate drive circuit is reduced.

16 Claims, 18 Drawing Sheets

(51) Int. Cl.
  *H02M 3/158* (2006.01)
  *H02M 7/219* (2006.01)
  *H03K 17/567* (2006.01)
  *H02M 7/5387* (2007.01)

(52) U.S. Cl.
  CPC ........ *H02M 7/219* (2013.01); *H02M 7/53875* (2013.01); *H03K 17/567* (2013.01); *H03K 2217/0036* (2013.01); *Y02B 70/1466* (2013.01)

(58) Field of Classification Search
  USPC .................................................. 327/108, 109
  See application file for complete search history.

(56) References Cited

U.S. PATENT DOCUMENTS

| | | | |
|---|---|---|---|
| 2005/0001659 A1 | 1/2005 | Inoshita | |
| 2006/0290388 A1 | 12/2006 | Tolle et al. | |
| 2011/0215840 A1* | 9/2011 | Machida | H03K 3/00 |
| | | | 327/109 |
| 2014/0201543 A1* | 7/2014 | Knoedgen | H03K 17/6877 |
| | | | 713/300 |

* cited by examiner

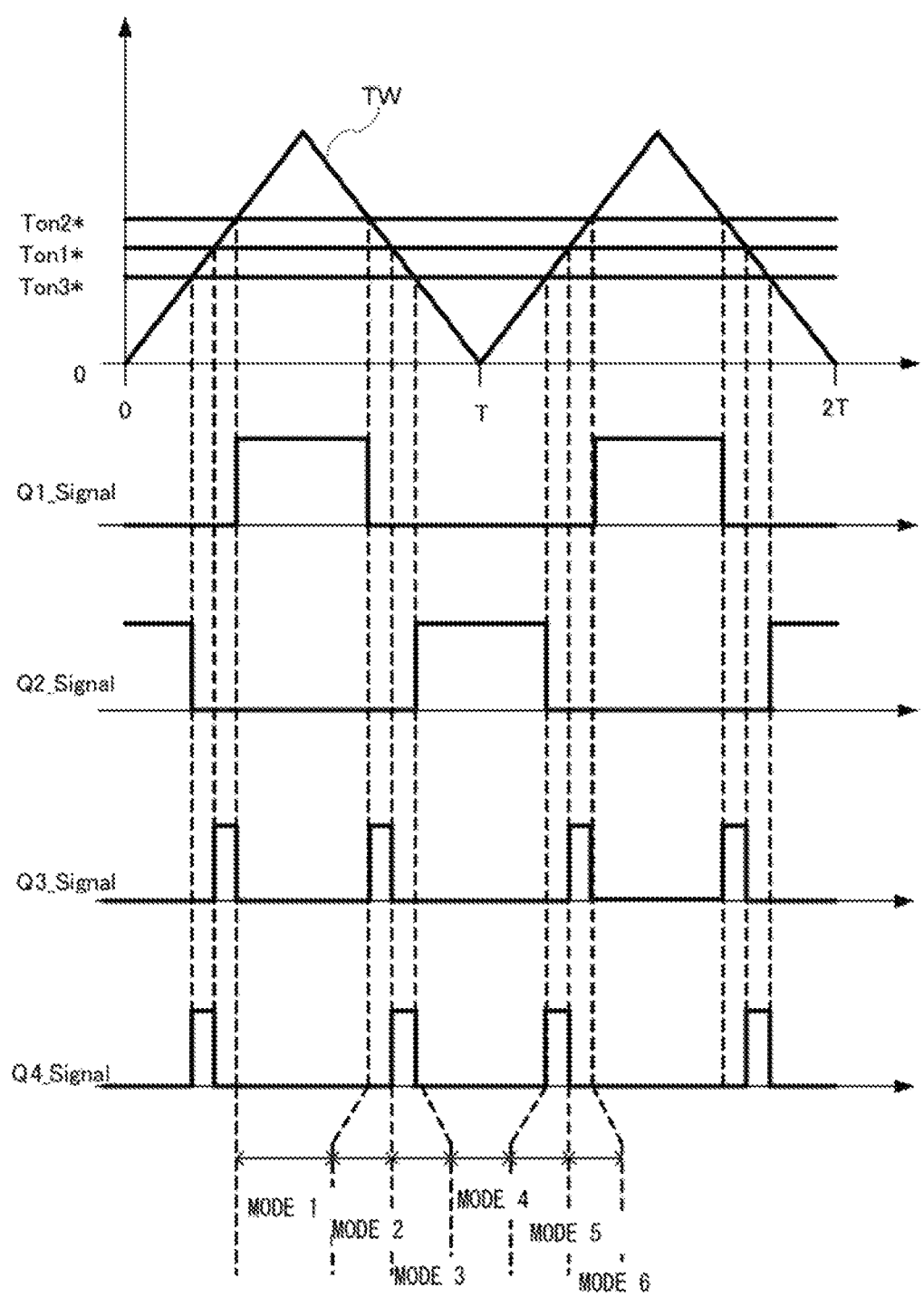

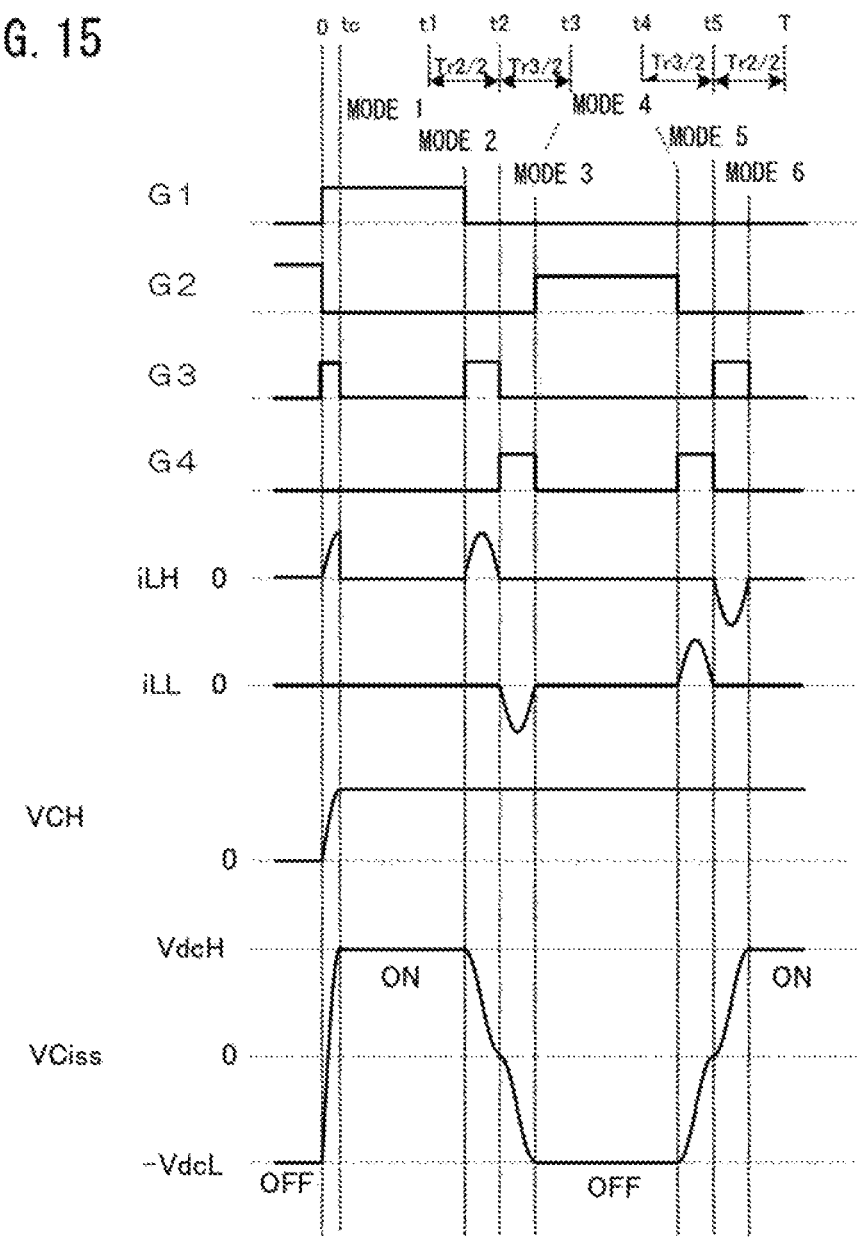

GATE DRIVE CIRCUIT, THAT SUPPLIES POWER TO A GATE OF A SEMICONDUCTOR SWITCHING ELEMENT, AND CARRIES OUT A DRIVING ON AND OFF OF THE GATE

TECHNICAL FIELD

The present invention relates to a gate drive circuit that supplies power to a gate of a semiconductor element and drives the gate.

BACKGROUND ART

A gate drive circuit of a voltage-driven semiconductor switching element (a drive target semiconductor element) includes a drive-on element that applies an on-state voltage to a gate of the drive target semiconductor element, and a drive-off element that applies an off-state voltage to the gate. The gate of the drive target semiconductor element is controlled by complementary switching of the drive-on and drive-off elements.

When voltage is applied to the gate of the drive target semiconductor element, a gate voltage changes by a ratio in accordance with a constant determined by a parasitic capacitance of the gate and the wiring resistance connected to the gate. Because the resistance is connected to the gate, the peak current and charge rate must be reduced to mitigate switching noise.

However, there is a problem with conductivity loss caused by the gate resistance due to an increased switching frequency of the drive target semiconductor element, because of which, furthermore, there is a proposal for a still more easily controlled gate drive circuit such that both switching loss and noise are reduced, in addition to which conduction loss in the gate drive circuit is reduced, by the gate resistance being replaced with a reactor, and an LC resonant circuit being configured of the reactor and the parasitic capacitance of the drive target semiconductor element gate as an auxiliary drive unit (Patent Document 1).

That is, the gate drive circuit proposed in Patent Document 1 includes a direct current power supply circuit with an IGBT (insulated gate bipolar transistor) as a semiconductor switching element (a drive target semiconductor element), and a first direct current power supply and a second direct current power supply connected in series with a connection point thereof taken as a power supply intermediate point and adopted as a reference potential, and a drive element unit formed of a drive-on element, which interrupts a first power supply path along which a positive voltage of the first direct current power supply is supplied to a gate of the drive target semiconductor element, and a drive-off element, which interrupts a second power supply path along which a negative voltage of the second direct current power supply is supplied to the gate of the drive target semiconductor element, and furthermore, an auxiliary drive unit wherein a reactor and the switching element are connected in series is provided between the power supply intermediate point and the gate of the drive target semiconductor element.

Further, the drive element unit is controlled by a drive control unit, an on-state voltage necessary in order to achieve an on-state is applied via the drive-on element to the gate of the drive target semiconductor element when the drive control unit turns on the drive-on element, and an off-state voltage necessary in order to achieve an off-state is applied to the gate of the drive target semiconductor element when the drive control unit turns on the drive-off element.

Also, a configuration is such that when the drive control unit turns off both the drive-on element and the drive-off element, a resonant circuit is formed of the reactor configuring the auxiliary drive unit and parasitic capacitance of the gate of the drive target semiconductor element.

In a state wherein the gate of the drive target semiconductor element is in an on-state, that is, in a state wherein the drive-on element is turned on and the drive-off element is turned off, current flows from the gate side of the drive target semiconductor element toward the reactor in the reactor. When the drive-on element is turned off in this state, an accumulated charge of the parasitic capacitance of the gate of the drive target semiconductor element is released and becomes zero due to resonance of the resonant circuit, or the current continues to flow so that the parasitic capacitance is further charged at reverse polarity. As a result of this, the gate voltage decreases sharply, together with which voltage across the drive target semiconductor element (source-to drain voltage, collector-to-emitter voltage) increases sharply, and the drive element is turned off. Further, when the gate voltage of the drive target semiconductor element reaches the off-state voltage and the drive control unit turns on the drive-off element, the drive target semiconductor element is held in the off-state by the gate voltage being held at the off-state voltage.

Meanwhile, in a state wherein the gate of the drive target semiconductor element is in an off-state, that is, in a state wherein the drive-on element is turned off and the drive-off element is turned on, current flows from the reactor toward the gate side of the drive target semiconductor element. When the drive-off element is turned off in this state, an accumulated charge of the parasitic capacitance of the gate of the drive target semiconductor element is released, and the parasitic capacitance is further charged at reverse polarity, due to resonance of the resonant circuit, or the current continues to flow in a direction such as to charge from a state wherein the accumulated charge is zero. As a result of this, the gate voltage increases sharply, together with which voltage across the drive target semiconductor element decreases sharply, and the drive target semiconductor element is turned on. Further, when the gate voltage of the drive target semiconductor element reaches the on-state voltage and the drive control unit turns on the drive-on element, the drive target semiconductor element is held in the on-state by the gate voltage being held at the on-state voltage.

In the auxiliary drive unit, current of a magnitude necessary in order to cause the gate voltage to change to the off-state voltage or the on-state voltage due to resonance needs to be caused to flow into the reactor until the drive-on element is turned off when turning off the drive target semiconductor element, and until the drive-off element is turned off when turning on the drive target semiconductor element. In other words, as there is no need to cause a current greater than this to flow, power consumption in the gate drive circuit can be further reduced by controlling a period for which current is caused to flow into the reactor.

CITATION LIST

Patent Literature

Patent Document 1: JP-A-2005-039988

SUMMARY OF INVENTION

Technical Problem

However, the gate drive circuit proposed in Patent Document 1 is such that the reactor is provided in the auxiliary drive unit, recovered power is accumulated as exciting energy of the reactor, after which all of the accumulated energy is supplied at reverse polarity between the gate and the source, and a gate-to-source potential is such that voltage when turned on and voltage when turned off are always the same. Also, when a gate-to-source rated voltage of a drive target semiconductor element to be driven differs between a positive electrode and a negative electrode, there is concern that a voltage exceeding a breakdown voltage will be applied between the gate and the source, causing the drive target semiconductor element to break. Furthermore, when the lower voltage of the rated voltages of the positive electrode and the negative electrode is specified as a gate power supply voltage, there is a problem in that the voltage applied between the gate and the source decreases, and there is concern that capacity (switching speed, on-state resistance) of the drive target semiconductor element will be reduced.

Because of this, the invention has an object of providing a small gate drive circuit by further developing the power recovery technology proposed in Patent Document 1, and reducing a gate drive power supply voltage.

Solution to Problem

A gate drive circuit includes a drive-on element that applies an on-state voltage to a gate of a drive target semiconductor element, a drive-off element that applies an off-state voltage to the gate of the drive target semiconductor element, a recovery circuit including a positive electrode side recovery circuit such that a positive electrode side recovery switch, a positive electrode side reactor, and a positive electrode side capacitor are connected in series and a negative electrode side recovery circuit such that a negative electrode side recovery switch, a negative electrode side reactor, and a negative electrode side capacitor are connected in series is connected between output terminals of the gate drive circuit and which can recover a charge accumulated in input capacitance of the drive target semiconductor element when the drive target semiconductor element is turned on, and a control circuit that controls the drive-on element, the drive-off element, and the recovery switch the positive electrode side recovery switch, and the negative electrode side recovery switch, and a charge accumulated in input capacitance of the drive target semiconductor element can be recovered when the drive target semiconductor element is turned on or turned off.

Advantageous Effects of Invention

A gate drive circuit of the invention is such that when a drive target semiconductor element is turned on or turned off, a charge driving the drive target semiconductor element can be recovered and supplied using a capacitor provided in a recovery circuit connected between output terminals, because of which it is sufficient that gate power supplies supplied by a drive-on element and a drive-off element, compensate for a deficiency in power, and total power of a positive electrode side gate power supply and a negative electrode side gate power supply can be considerably reduced. Because of this, a reduction in size of a gate power supply circuit can be realized.

BRIEF DESCRIPTION OF DRAWINGS

FIG. 14 is a waveform diagram showing the generation of drive signals according to the second embodiment of the invention.

FIG. 15 is an operations chart according to a third embodiment of the invention.

DESCRIPTION OF EMBODIMENTS

First Embodiment

Figure 1:
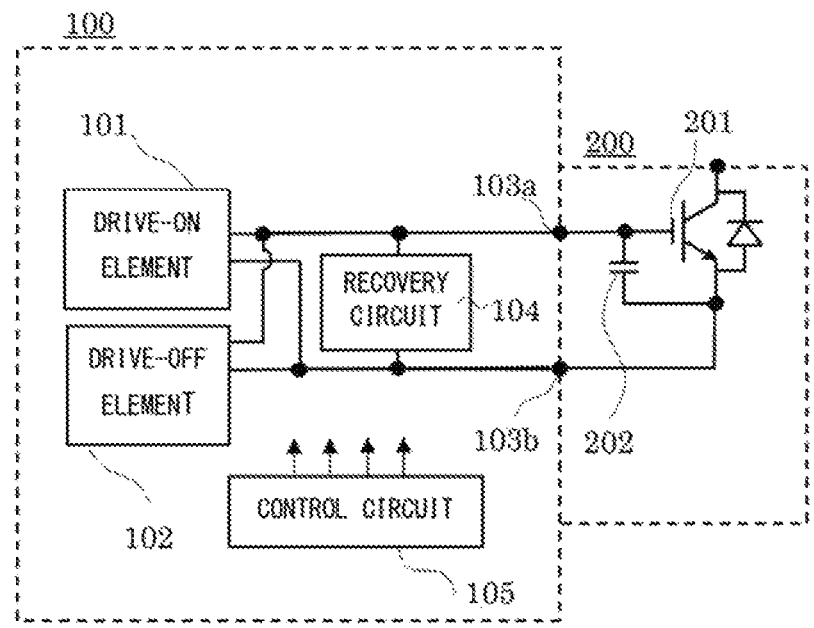
FIG. 1 is a block diagram showing a configuration of a gate drive circuit according to a first embodiment of the invention.

Hereafter, an embodiment of the invention will be described, based on the drawings.

A gate drive circuit 100 of the invention includes a drive-on element 101, which applies an on-state voltage to a gate 201 of a voltage-driven semiconductor switching element (a drive target semiconductor element) 200, and a drive-off element 102, which applies an off-state voltage to the gate 201 of the drive target semiconductor element 200. Also, a recovery circuit 104 is connected between output terminals 103a and 103b of the gate drive circuit 100. Furthermore, a control circuit 105 is provided in the gate drive circuit 100, and the control circuit 105 is configured so as to control operations of the drive-on element 101, the drive-off element 102, and the recovery circuit 104.

Figure 2:
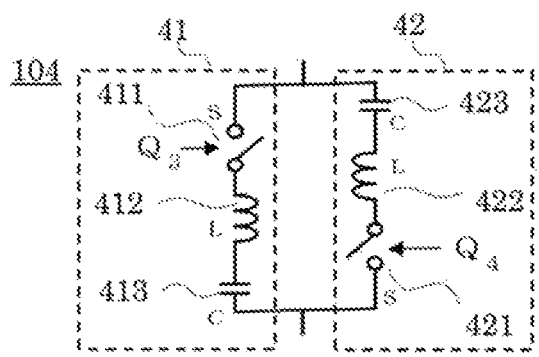
FIG. 2 is a configuration diagram of a recovery circuit used in the first embodiment of the invention.

Also, as shown in FIG. 2, the recovery circuit 104 is configured of a positive electrode side recovery circuit 41 and a negative electrode side recovery circuit 42, and the positive electrode side recovery circuit 41 is configured by a positive electrode side recovery switch 411, a positive electrode side reactor 412, and a positive electrode side capacitor 413 being connected in series. Also, the negative electrode side recovery circuit 42 is configured by a negative electrode side recovery switch 421, a negative electrode side reactor 422, and a negative electrode side capacitor 423 being connected in series.

Figure 3:
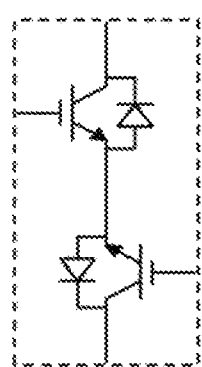
FIG. 3 is a configuration diagram of a recovery switch used in the first embodiment of the invention.

The positive electrode side recovery switch 411 is a switch that transmits power in two directions. That is, the positive electrode side recovery switch 411 transmits power in two directions when turned on, and interrupts power in both directions when turned off. For example, as shown in FIG. 3, a configuration is such that two active semiconductors are connected in series as opposite polarities. Although an IGBT is shown in FIG. 3, the positive electrode side recovery switch 411 may be an active semiconductor including input capacitance that is driven on and off by separate excitation, such as a MOSFET, a transistor, or a thyristor.

Also, the negative electrode side recovery switch 421 is also a switch that transmits power in two directions, in the same way as the positive electrode side recovery switch 411, and is of a configuration such that two active semiconductor s are connected in series as opposite polarities, as shown in FIG. 3.

The gate drive circuit 100 of the configuration shown in the first embodiment is such that when turning on the drive target semiconductor element 200, the drive-off element 102 is turned off, after which a charge accumulated in input capacitance 202 of the drive target semiconductor element 200 is accumulated in the negative electrode side capacitor 423 of the negative electrode side recovery circuit 42, with the bidirectional switch 421 of the negative electrode side recovery circuit 42 turned on for a certain period, and furthermore, a charge is supplied to the input capacitance 202 of the drive target semiconductor element 200 from the positive electrode side capacitor 413 of the positive electrode side recovery circuit 41, with the positive electrode side recovery switch 411 of the positive electrode side recovery circuit 41 turned on for a certain period. Lastly, the on-state of the drive target semiconductor element 200 is maintained with the drive-on element 101 turned on.

When turning off the drive target semiconductor element 200, the drive-on element 101 on the positive electrode side is turned off, after which a charge accumulated in the input capacitance 202 of the drive target semiconductor element 200 is accumulated in the positive electrode side capacitor 413 of the positive electrode side recovery circuit 41, with the positive electrode side recovery switch 411 of the positive electrode side recovery circuit 41 turned on for a certain period, and furthermore, a charge is supplied to the input capacitance 202 of the drive target semiconductor element 200 from the negative electrode side capacitor 423 of the negative electrode side recovery circuit 42, with the bidirectional switch 421 of the negative electrode side recovery circuit 42 turned on for a certain period. Lastly, the off-state of the drive target semiconductor element 200 is maintained with the drive-off element 102 on the negative electrode side turned on.

By charges being supplied from the positive electrode side capacitor 413 provided in the positive electrode side recovery circuit 41 and the negative electrode side capacitor 423 provided in the negative electrode side recovery circuit 42 in this way, capacitances of a positive electrode side direct current power supply and a negative electrode side direct current, power supply are reduced both when turning on and when turning off.

Second Embodiment

Figure 4:
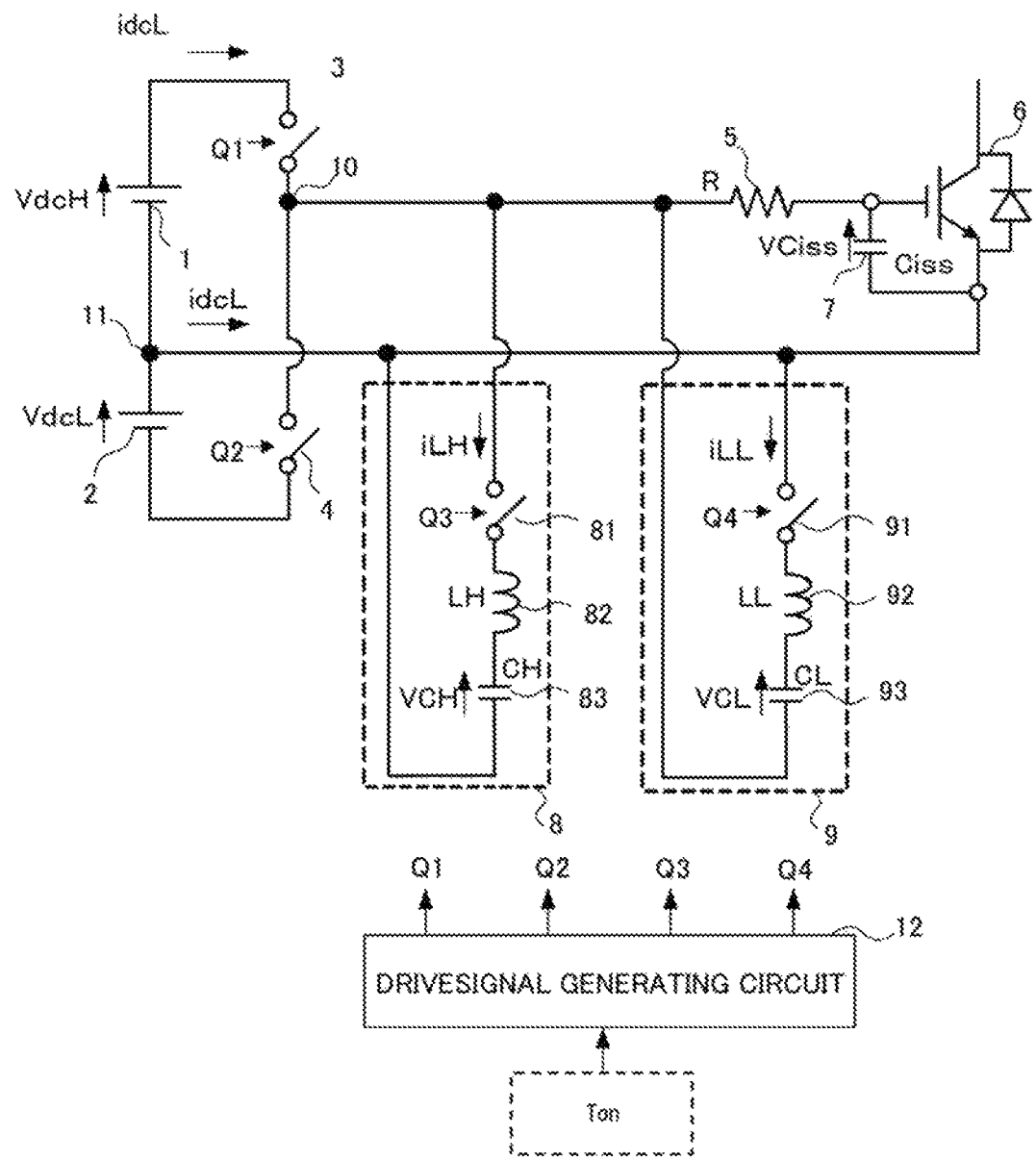
FIG. 4 is a configuration diagram showing a specific example of a gate drive circuit according to a second embodiment of the invention.
Figure 5:
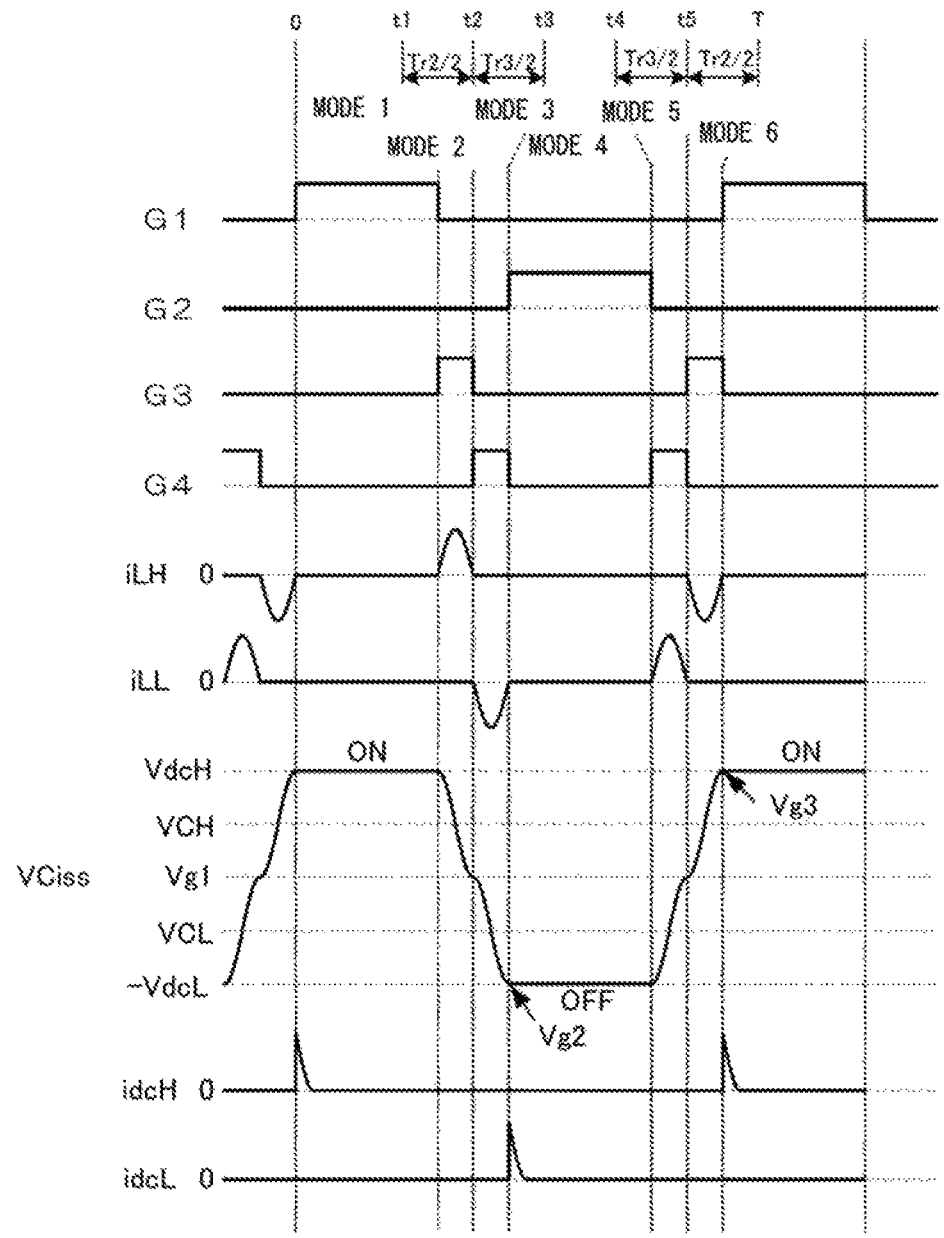
FIG. 5 is an operations chart according to the second embodiment of the invention.

A specific configuration of the gate drive circuit 100 is shown in FIG. 4. FIG. 4 is a specific circuit configuration diagram of the gate drive circuit 100 shown in the first embodiment. FIG. 5 is an operations chart. Also, FIG. 6 to FIG. 11 are operating principle diagrams representing operations of the gate drive circuit of FIG. 4.

In FIG. 4, the drive target semiconductor element 200 shown in FIG. 1 is illustrated as a drive target semiconductor element 6, and the input capacitance 202 is illustrated as input capacitance 7. Also, the control circuit 105 is illustrated as a drive signal generating circuit 12.

As shown in FIG. 4, a voltage-driven switching element including the input capacitance 7 is taken as the drive target semiconductor element 6, and in order to drive the drive target semiconductor element 6 on and off, the gate drive circuit 100 includes a positive electrode side gate power supply 1, a negative electrode side gate power supply 2, a positive electrode side driver switch 3 (Q1), a negative electrode side driver switch 4 (Q2), and gate resistance 5.

The positive electrode side driver switch 3 (Q1) and the negative electrode side driver switch 4 (Q2) shown in FIG. 4 are configured of, for example, MOSFETs, IGBTs, transistors, or thyristors. A voltage value VdcH of the positive electrode side gate power supply 1 is input as Vciss by the positive electrode side driver switch 3 (Q1) being turned on, and the drive target semiconductor element 6 is turned on. Also, a voltage −VdcL of the negative electrode side gate power supply 2 is input as Vciss by the negative electrode side driver switch 4 (Q2) being turned on, and the drive target semiconductor element 6 is turned off.

The gate resistance 5 is current limiting resistance when supplying current to the input capacitance 7 from the positive electrode side gate power supply 1 or the negative electrode side gate power supply 2, and clamping Vciss.

The recovery circuit 104 shown in FIG. 1 is configured of a positive electrode side recovery circuit 8 and a negative electrode side recovery circuit 9 in FIG. 4.

The positive electrode side recovery circuit 8 is configured of a circuit wherein a positive electrode side recovery switch 81, a positive electrode side reactor 82, and a positive electrode side tank capacitor 83 are connected in series, and is connected between a gate side terminal 10 of the drive target semiconductor element 6 and a source side terminal 11 of the drive target semiconductor element 6.

The negative electrode side recovery circuit 9 is configured of a circuit wherein a negative electrode side recovery switch 91, a negative electrode side reactor 92, and a negative electrode side tank capacitor 93 are connected in series, and is connected between the gate side terminal 10 of the drive target semiconductor element 6 and the source side terminal 11 of the drive target semiconductor element 6.

The drive signal generating circuit 12 outputs a drive signal of the positive electrode side driver switch 3 (Q1), a drive signal of the negative electrode side driver switch 4 (Q2), a drive signal of the positive electrode side recovery switch 81 (Q3), and a drive signal of the negative electrode side recovery switch 91 (Q4), based on a drive signal Ton that starts a drive of the drive target semiconductor element 6.

Herein, voltage of the positive electrode side gate power supply 1 is taken to be VdcH, voltage of the negative electrode side gate power supply 2 is taken to be VdcL, and a gate voltage applied to the input capacitance 7 is taken to be Vciss.

As described using FIG. 1, the positive electrode side recovery switch 81 needs to be a switch that transmits power in two directions.

That is, the positive electrode side recovery switch 81 needs to transmit power in two directions when turned on, and interrupt power in both directions when turned off. For example, as shown in FIG. 3, a configuration is such that two active semiconductors are connected in series as opposite polarities. Although an IGBT is shown in FIG. 3, the positive electrode side recovery switch 81 may be an active semiconductor including input capacitance that is driven on and off by separate excitation, such as a MOSFET, a transistor, or a thyristor.

By the positive electrode side recovery switch 81 including a function of transmitting power in two directions, a positive electrode charge accumulated in the input capacitance 7 is recovered in the positive electrode side tank capacitor 83, or a positive electrode charge is accumulated in the input capacitance 7 from the positive electrode side tank capacitor 83, utilizing a resonance action of the input capacitance 7 and the positive electrode side reactor 82.

As the negative electrode side recovery switch 91 also needs to be a switch that transmits power in two directions, in the same way as the positive electrode side recovery switch 81, a configuration such that two active semiconductors are connected in series as opposite polarities, as shown in FIG. 3, is proposed. By the negative electrode side recovery switch 91 including a function of transmitting power in two directions, a negative electrode charge accumulated in the input capacitance 7 is recovered in the negative electrode side tank capacitor 93, or a negative electrode charge is accumulated in the input capacitance 7 from the negative electrode side tank capacitor 93, utilizing a resonance action of the input capacitance 7 and the negative electrode side reactor 92.

Capacitance of the positive electrode side tank capacitor 83 is set to be sufficiently large with respect to the input capacitance 7, so as not to affect resonance conditions of the input capacitance 7 and the positive electrode side reactor 82. In the same way, capacitance of the negative electrode side tank capacitor 93 is set to be sufficiently large with respect to a capacitance Ciss of the input capacitance 7.

The voltage value VdcH of the positive electrode side gate power supply 1 is set to a value such that sufficient performance is secured with regard to voltage drop and switching characteristics of the drive target semiconductor element 6 when turned on. The voltage value VdcL of the negative electrode side gate power supply 2 is set to a value such that an off-state can be maintained without the drive target semiconductor element 6 exceeding an on-state threshold voltage due to noise or the like when turned off. Consequently, the voltage value VdcH of the positive electrode side gate power supply 1 and the voltage value VdcL of the negative electrode side gate power supply 2 can be set to differing arbitrary values, regardless of operations of the positive electrode side recovery circuit 3 and the negative electrode side recovery circuit 9.

Operational conditions of a gate signal G1 of the positive electrode side driver switch 3 (Q1), a gate signal G2 of the negative electrode side driver switch 4 (Q2), a gate signal G3 of the positive electrode side recovery switch 81 (Q3), and a gate signal G4 of the negative electrode side recovery switch 91 (Q4), and waveforms of the gate voltage Vciss, a positive electrode gate current idcH, and a negative electrode gate current idcL, are shown as an operations chart in FIG. 5.

Next, a description will be given of a principle of a switching operation of the drive target semiconductor element 6 according to the positive electrode side recovery circuit 8, in accordance with the current and voltage waveforms of each mode of FIG. 5 and the operating principle diagrams of FIG. 6 to FIG. 11.

As shown in FIG. 5, the gate signals G1, G2, G3, and G4 being at a high level means that the relevant switch is in an on-state, and the gate signals G1, G2, G3, and G4 being at a low level means that the relevant switch is in an off-state. When taking one cycle of switching to be T, a total of six modes exist in the cycle T, those being a mode 1 from a time 0 to a time t1, a mode 2 from the time t1 to a time t2, a mode 3 from the time t2 to a time t3, a mode 4 from the time t3 to a time t4, a mode 5 from the time t4 to a time t5, and a mode 6 from the time t5 to a time T.

In mode 1, an on-state of the drive target semiconductor element 6 is continued, and in mode 4, an off-state of the drive target semiconductor element 6 is continued.

In mode 2 and mode 3, there is a transient operating condition such that the drive target semiconductor element 6 is switched from an on-state to an off-state, and in mode 5 and mode 6, there is a transient operating condition such that the drive target semiconductor element 6 is switched from an off-state to an on-state.

In the second embodiment, a voltage value VCH of the positive electrode side tank capacitor 83 (CH) is set to a value shown in Expression 1. A voltage value VCL of the negative electrode side tank capacitor 93 (CL) is set to a value shown in Expression 2. Also, the voltage value VdcH of the positive electrode side gate power supply 1 and the voltage value VdcL of the negative electrode side gate power supply 2 are such that the relationship of Expression 3 is satisfied.

[Math. 1]

$$V_{CH} = (2V_{dCB} + 2V_{dCL})/4 \qquad (1)$$

[Math. 2]

$$V_{CL} = (V_{dCB} - 2V_{dCL})/4 \qquad (2)$$

[Math. 3]

$$V_{dCH} > VdCL \qquad (3)$$

Herein, in the second embodiment, the gate resistance 5 (R) shown in FIG. 4 has an effect as an attenuation component on a secondary resonance system of the capacitance value Ciss of the input capacitance 7 and a reactance value LH of the positive electrode side reactor 82, or the capacitance value Ciss of the input capacitance 7 and an LC resonant circuit. A resistance value R of the gate resistance 3 is extremely small, and constantly satisfies an oscillation condition with respect to the secondary resonance system. Furthermore, an effect on a resonance cycle, an amplitude value, and the like is also small, because of which the resistance value R of the gate resistance 5 is ignored in the expressions shown in this embodiment.

Hereafter, a description will be given of an operating principle when turning off the drive target semiconductor element 6 in shifting from mode 1 to mode 4.

Firstly, in mode 1, an on-state of the positive electrode side driver switch 3 (Q1) and an off-state of the negative electrode side driver switch 4 (Q2), the positive electrode side recovery switch 81 (Q3), and the negative electrode side recovery switch 91 (Q4) are continued. At this time, current flows from the positive electrode side gate power supply 1 via the gate resistance 5 to the input capacitance 7, as per a current path shown in FIG. 6. Consequently, Vciss is clamped at VdcH, and an on-state is continued. As the negative electrode side driver switch 4 (Q2), the positive electrode side recovery switch 81 (Q3), and the negative electrode side recovery switch 91 (Q4) are turned off, no conduction of current occurs.

Next, in mode 2, the positive electrode side recovery switch 81 (Q3) is turned on, and the positive electrode side driver switch 3 (Q1), the negative electrode side driver switch 4 (Q2), and the negative electrode side recovery switch 91 (Q4) are turned off. Under initial conditions of mode 2, (the gate voltage Vciss applied to the input capacitance 7)=(the voltage value VdcH of the positive electrode side gate power supply 1), because of which, according to Expression 1 and Expression 3, (the gate voltage Vciss applied to the input capacitance 7)>(the voltage value VCH of the positive electrode side tank capacitor 83 (CH)). Consequently, according to FIG. 7, a resonance current flows from the input capacitance 7 (Ciss) to the positive electrode side tank capacitor 83 (CH) in accordance with an arrow in the drawing.

In mode 2, the positive electrode side tank capacitor 83 (CH) undergoes a charging operation with respect to the polarity of VCH. As the capacitance of the positive electrode side tank capacitor 83 (CH) is sufficiently large compared with the input capacitance 7 (Ciss), a resonance model is configured of the input capacitance 7 (Ciss) and the positive electrode side reactor 82 (LH). A resonance cycle Tr2 fixed by the input capacitance 7 (Ciss) and the positive electrode side reactor 82 (LH) is expressed in Expression 4, and a period of mode 2 is taken to be a half-cycle Tr2/2 of the resonance cycle.

[Math. 4]

$$T_{r2}=2\pi\sqrt{(LH \times Ciss)} \qquad (4)$$

At this time, the gate voltage Vciss applied to the input capacitance 7 undergoes a voltage change having an amplitude of (VdcH−VCH), and is as in Expression 5. Also, t is a time variable.

[Math. 5]

$$V_{ciss}=V_{CH}+(V_{dCH}-V_{CH}) \times \cos(2\pi/T_{r2} \times t) \qquad (5)$$

Consequently, a voltage value Vg1 of the gate voltage Vciss applied to the input capacitance 7 of mode 2 is a value in accordance with Expression 6.

[Math. 6]

$$V_{g1}=V_{CH}-(V_{dCH}-V_{CH})=V_{dCL} \qquad (6)$$

Next, in mode 3, the negative electrode side recovery switch 91 (Q4) is turned on, and the positive electrode side driver switch 3 (Q1), the negative electrode side driver switch 4 (Q2), and the positive electrode side recovery switch 81 (Q3) are turned off. Under initial, conditions of mode 3, (the gate voltage Vciss applied to the input capacitance 7)=(the voltage value Vg1)−(the voltage value VdcL of the negative electrode side gate power supply 2), and (the voltage value Vg1)>(the voltage value VCL of the negative electrode side tank capacitor 93 (CL) are taken to be prerequisites. At this time, according to FIG. 8, a resonance current flows from the input capacitance 7 (Ciss) to the negative electrode side tank capacitor 93 (CL) in accordance with an arrow in the drawing. In mode 3, the negative electrode side tank capacitor 93 undergoes a discharge operation with respect to the polarity of VCL. As the capacitance of the negative electrode side tank capacitor 93 (CL) is sufficiently large compared with the input capacitance 7 (Ciss), a resonance model is configured of the input capacitance 7 (Ciss) and the negative electrode side reactor 92 (LL). A resonance cycle Tr3 fixed by the input capacitance 7 (Ciss) and the negative electrode side reactor 92 (LL) is expressed in Expression 7, and a period of mode 3 is taken to be a half-cycle Tr3/2 of the resonance cycle.

[Math. 7]

$$T_{r3}=2\pi\sqrt{(LL \times Ciss)} \qquad (7)$$

At this time, the gate voltage Vciss applied to the input capacitance 7 undergoes a voltage change having an amplitude of (Vg1−VCL), and is as in Expression 8. Also, t is a time variable.

[Math. 8]

$$V_{ciss}=V_{CL}+(V_{g1}-V_{CL}) \times \cos(2\pi/T_{r3} \times t) \qquad (8)$$

Consequently, a voltage value Vg2 of the gate voltage Vciss applied to the input capacitance 7 of mode 3 is a value in accordance with Expression 9.

[Math. 9]

$$V_{g2}=V_{CL}-(V_{g1}-V_{CL})=2V_{CL}-V_{g1}=-V_{dCL} \qquad (9)$$

In mode 4, an on-state of the negative electrode side driver switch 4 (Q2) and an-off state of the positive electrode side driver switch 3 (Q1), the positive electrode side recovery switch 81 (Q3), and the negative electrode side recovery switch 91 (Q4) are continued. At this time, current flews from the negative electrode side gate power supply 2 via the gate resistance 5 to the input capacitance 7, as per a current path shown in FIG. 9.

The gate voltage Vciss applied to the input capacitance 7 is clamped at the voltage value −VdcL of the negative electrode side gate power supply 2, and an off-state is continued. As the positive electrode side driver switch 3 (Q1), the positive electrode side recovery switch 81 (Q3), and the negative electrode side recovery switch 91 (Q4) are turned off, no conduction of current occurs.

In this way, by the gate voltage Vciss applied to the input capacitance 7 being reduced using the positive electrode side recovery circuit 8 in mode 2, and reduced using the negative electrode side recovery circuit in mode 3, from mode 1 in which the on state of the drive target semiconductor element 6 is continued, the gate voltage Vciss is reduced as far as the voltage value −VdcL of the negative electrode side gate power supply 2. Expression 4 to Expression 9 are cases in which the resistance component is ignored, but when actually taking gate resistance and a part resistance component into consideration, the voltage value Vg2>−VdcL. In this case, the gate voltage Vciss applied to the input capacitance 7 is changed from Vg2 to −VdcL, because of which a power amount Pdc1 supplied from the negative electrode side gate power supply 2 is expressed in Expression 10. Herein, switching frequency is taken to be fsw.

[Math. 10]

$$P_{dc1}=C_{iss} \times (V_{dCL}+V_{g2})^2 \times f_{sw} \qquad (10)$$

According to Expression 10, an amount of power equivalent to a voltage difference between VdcL and Vg2 is the amount of power needed from the negative electrode side gate power supply 2. A common gate circuit that has no recovery function is such that a voltage value Vg2 remains at VdcH, as shown in Expression 11, and a power amount Pdc2 thereof is greater than in Expression 10.

[Math. 11]

$$P_{dc2}=C_{iss}\times(V_{dCL}+V_{dCH})^2\times f_{sw} \qquad (11)$$

By mode 2 and mode 3 being provided when turning off in this way, the power amount from the negative electrode side gate power supply 2 when turning off can be considerably reduced.

When shifting to mode 5 from the state in mode 4 wherein, an on-state of the negative electrode side driver switch 4 (Q2) and an-off state of the positive electrode side driver switch 3 (Q1), the positive electrode side recovery switch 81 (Q3), and the negative electrode side recovery switch 91 (Q4) are continued, the negative electrode side recovery switch 91 (Q4) is turned on, and the positive electrode side driver switch 3 (Q1), the negative electrode side driver switch 4 (Q2), and the positive electrode side recovery switch 81 (Q3) are turned off. Under initial conditions of mode 5, the gate voltage Vciss applied to the input capacitance 7=−VdcL and VCL>−VdcL are satisfied. In this case, a resonance current flows from the input capacitance 7 (Ciss) to the negative electrode side tank capacitor 93 (CL), as shown by an arrow in FIG. 10.

In mode 5, the negative electrode side tank capacitor 93 undergoes a charging operation with respect to the polarity of VCL. In the same way as in mode 3, a resonance model is configured of the input capacitance 7 (Ciss) and the negative electrode side reactor 92 (LL). The resonance cycle Tr3 fixed by the input capacitance 7 (Ciss) and the negative electrode side reactor 92 (LL) is such that a period of mode 5 is also Tr3/2, in the same way as in Expression 7. At this time, the gate voltage Vciss applied to the input capacitance 7 undergoes a voltage change having an amplitude of (VdcL−VCL), and is as in Expression 12. Also, t is a time variable.

[Math. 12]

$$V_{ciss}=V_{CL}-(V_{dCL}-V_{CL})\times\cos(2\pi/T_{r3}\times t) \qquad (12)$$

Consequently, the voltage value Vg1 of the gate voltage Vciss applied to the input capacitance 7 of mode 5 is a value in accordance with Expression 13.

[Math. 13]

$$V_{g1}=V_{CL}+(V_{dCL}-V_{CL})=V_{dCL} \qquad (13)$$

VdcL in Expression 13 is the same as in Expression 6.

Next, in mode 6, the positive electrode side recovery switch 81 (Q3) is turned on, and the positive electrode side driver switch 3 (Q1), the negative electrode side driver switch 4 (Q2), and the negative electrode side recovery switch 91 (Q4) are turned off.

Under initial conditions of mode 6, (the gate voltage Vciss applied to the input capacitance 7)=VdcL and VCH>−VdcL are satisfied. Consequently, a resonance current flows from the positive electrode side tank, capacitor 83 (CH) to the input capacitance 7 (Ciss) in accordance with the direction of an arrow in FIG. 11.

Also, in mode 6, the positive electrode side tank capacitor 83 undergoes a discharge operation with respect to the polarity of VCH. In the same way as in mode 2, a resonance model is configured between the input capacitance 7 (Ciss) and the positive electrode side reactor 82 (LH). Also, a resonance cycle is also such that a period of mode 6 is Tr2/2, in the same way as in Expression 4. At this time, the gate voltage Vciss applied to the input capacitance 7 undergoes a voltage change having an amplitude of (VCH−Vg1), that is, (VCH−VdcL), and is as in Expression 14. Also, t is a time variable.

[Math. 14]

$$V_{ciss}=V_{CH}-(V_{CH}-V_{dCL})\times\cos(2\pi/T_{r2}\times t) \qquad (14)$$

Consequently, a voltage value Vg3 of the gate voltage Vciss of mode 6 is a value in accordance with Expression 1 to Expression 15.

[Math. 15]

$$V_{g3}=2V_{CH}-V_{dCL}=V_{dCH} \qquad (15)$$

Next, in mode 1 again, an on-state of the positive electrode side driver switch 3 (Q1) and an-off state of the negative electrode side driver switch 4 (Q2), the positive electrode side recovery switch 81 (Q3), and the negative electrode side recovery switch 91 (Q4) are continued. At this time, current flows from the positive electrode side gate power supply 1 via the gate resistance 5 to the input capacitance 7, as per the current path shewn in FIG. 6. The gate voltage Vciss applied to the input capacitance 7 is clamped at the voltage value VdcH of the positive electrode side gate power supply 1, and an on-state is continued.

In this way, the periods of mode 5 and mode 6 are provided, the gate voltage Vciss is increased using the negative electrode side recovery circuit 9 in mode 5, and the gate voltage Vciss is increased as far as VdcK using the positive electrode side recovery circuit 8 in mode 6, from the state in which an off-state of the drive target semiconductor element 6 is continued in mode 4. Expression 15 is an analytic expression of a case in which the resistance component is ignored, but when actually taking gate resistance and a part resistance component into consideration, Vg3<VdcH.

In this case, the gate voltage Vciss is changed from Vg3 to VdcH, because of which the power amount Pdc1 supplied from the positive electrode side gate power supply 1 is expressed in Expression 16.

[Math. 16]

$$P_{dc1}=C_{iss}\times(V_{dCH}-V_{g3})^2\times f_{sw} \qquad (16)$$

According to Expression 16, an amount of power equivalent to a voltage difference between VdcH and Vg3 is the amount of power needed from the positive electrode side gate power supply

1. A common gate circuit that has no recovery function is such that Vg3 remains at −VdcL, as shown in Expression 17, and the power amount Pdc2 thereof is greater than in Expression 16.

[Math. 17]

$$P_{dc2}=C_{iss}\times(V_{dCH}+V_{dCL})^2\times f_{sw} \qquad (17)$$

By mode 5 and mode 6 being provided when turning on in this way, the power amount from the positive electrode side gate power supply 1 when turning on can be considerably reduced.

Furthermore, a gate power supply power amount Pdc1 that is a combination of the Pdc1 when turning off and the Pdc1 when turning on described in this embodiment is expressed in Expression 18.

[Math. 18]

$$P_{dc1} = C_{iss} \times ((V_{dCH} - V_{g3})^2 + (V_{dCL} + V_{g2})^2) \times f_{sw} \quad (18)$$

Also, in a case of a common gate circuit that has no recovery function, a gate power supply power amount Pdc2 is as in Expression 19, and a power supply capacitance determined by a total voltage of VdcH and VdcL is supplied.

[Math. 19]

$$P_{dc2} = C_{iss} \times (2 \times (V_{dCH} + V_{dCL})_2)^2 \times f_{sw} \quad (19)$$

According to Expression 18 and Expression 19, this embodiment is such that the voltage value Vg2 is without exception equivalent to −VdcL, and the voltage value Vg3 is without exception equivalent to VdcH, because of which the gate power supply capacitance can be reduced in comparison with the power amount Pdc2 of the common gate circuit shown in Expression 19. Ideally, when circuit resistance is zero, Vg2=−VdcL and Vg3=VdcH, because of which the amount of power Pdc1=0, and the gate power supply capacitance is zero.

A steady state operation is such that the positive electrode side tank capacitor 83 undergoes a charging operation in mode 2, and undergoes a discharge operation in mode 6. As mode 2 and mode 6 are the same resonance model, the values of the resonance current and the resonance cycles are the same, and the increase and reduction of VCH are equal. In the same way, the negative electrode side tank capacitor 93 undergoes a discharge operation in mode 3, and undergoes a charging operation in mode 5, and as mode 3 and mode 5 are the same resonance model, the values of the resonance current and the resonance cycles are the same, and the increase and reduction of VCL are balanced. Consequently, the VCH and VCL voltages routinely converge at a certain value.

The VCH convergence voltage converges at an intermediate voltage between Vg1 and VdcH, that is, at Expression 20 shown below. In this case, the changes in the gate voltage Vciss applied in mode 2 and mode 6 are equal, and a charge amount and discharge amount of the positive electrode side tank capacitor 83 are equal.

[Math. 20]

$$V_{CH} = (V_{g1} + V_{dCH})/2 = (V_{dCH} + V_{dCL})/2 \quad (20)$$

The VCL convergence voltage converges at an intermediate voltage between Vg1 and VdcL, that is, at Expression 21 shown below. In this case, the changes in the gate voltage Vciss applied in mode 3 and mode 5 are equal, and a charge amount and discharge amount of the negative electrode side tank capacitor 93 are equal.

[Math. 21]

$$V_{CL} = (V_{g1} - V_{dCH})/2 = 0 \quad (21)$$

The switching between an on-state and an off-state of the positive electrode side driver switch 3 (Q1), the negative electrode side driver switch 4 (Q2), the positive electrode side recovery switch 81 (Q3), and the negative electrode side recovery switch 91 (Q4) in mode 1 to mode 6 is all carried out consecutively, as shown in FIG. 5. That is, there is no occurrence of an operating mode wherein the positive electrode side driver switch 3 (Q1), the negative electrode side driver switch 4 (Q2), the positive electrode side recovery switch 81 (Q3), and the negative electrode side recovery switch 91 (Q4) are simultaneously in an off-state. Also, as the resonance models in mode 2 and mode 3 are the same, Tr2 (the resonance cycle fixed by Ciss and LH) and Tr3 (the resonance cycle fixed by Ciss and LL) are equal.

By the period of mode 2 being set to Tr2/2 when turning off, iLH becomes a zero current when turning on and turning off the positive electrode side recovery switch 81 (Q3), because of which zero current switching is established. Similarly, by the period of mode 3 being set to Tr3/2, ILL becomes a zero current when turning on and turning off the negative electrode side recovery switch 91 (Q4), because of which zero current switching is established. Similarly, by the periods of mode 4 and mode 5 being set to Tr 3/2 and Tr2/2 respectively when turning on, iLH becomes a zero current when turning on and turning off the positive electrode side recovery switch 81 (Q3), and iLL becomes a zero current when turning on and turning off the negative electrode side recovery switch 91 (Q4). Consequently, loss occurring in the positive electrode side recovery switch 81 (Q3) and the negative electrode side recovery switch 91 (Q4) is only conduction loss, and charge recovery efficiency of the input capacitance 7 (Ciss) can be increased.

In this embodiment, it is taken that VCL=0V and Vg1=VdcL, as previously described, and furthermore, it is taken that an on/off threshold voltage (Vth) of the gate-to-source voltage (the gate voltage Vciss) of the drive target semiconductor element is 0V to VdcL. In this case, an on-state is continued in mode 2, and the on-state is switched to an off-state in mode 3. The off-state is switched to an on-state in mode 5. The on-state is continued in mode 6.

In this case, the on-state period is the total of the periods of mode 6, mode 1, and mode 2. The off-state period is mode 4, and transient times between the on-state and the off-state are the periods of mode 3 and mode 5. Consequently, an on-state period TON of the drive target semiconductor element is expressed in Expression 22. The period of mode 1 is taken to be T1.

[Math. 22]

$$T_{ON} = T_1 + T_{r2} \quad (22)$$

Figure 12A:
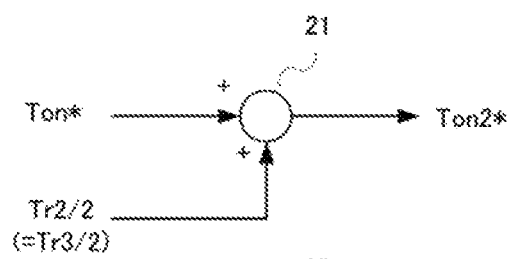
FIG. 12A is a block diagram of a drive signal generation according to the second embodiment of the invention.
Figure 12B:
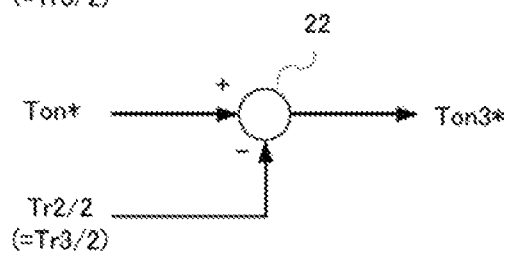
FIG. 12B is a block diagram of a drive signal generation according to the second embodiment of the invention.
Figure 13A:
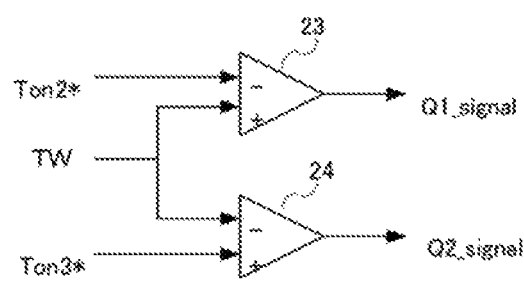
FIG. 13A is a block diagram of a drive signal generation according to the second embodiment of the invention.
Figure 13B:
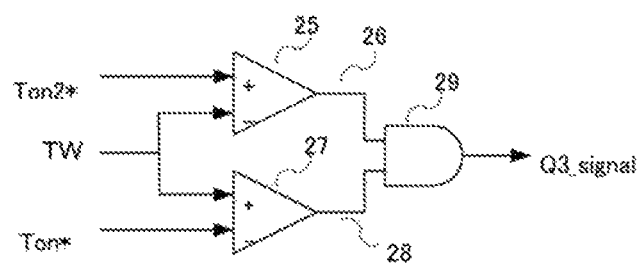
FIG. 13B is a block diagram of a drive signal generation according to the second embodiment of the invention.
Figure 13C:
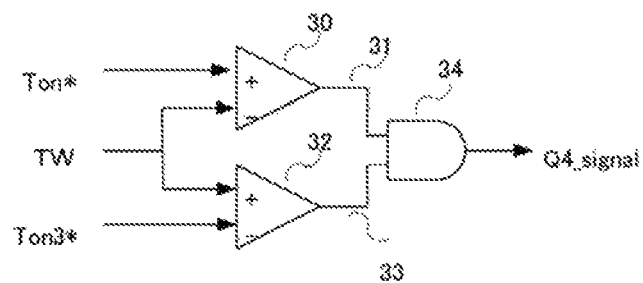
FIG. 13C is a block diagram of a drive signal generation according to the second embodiment of the invention.

Next, a process of generating drive signals to the positive electrode side driver switch 3 (Q1), the negative electrode side driver switch 4 (Q2), the positive electrode side recovery switch 81 (Q3), and the negative electrode side recovery switch 91 (Q4) in the drive signal generating circuit 12 will be described using FIG. 12A, FIG. 12B, FIG. 13A, FIG. 13B, and FIG. 13C. FIG. 12A and FIG. 12B are block diagrams representing a generation from a duty command value Ton* of on-state period correction duty command values Ton*2 and Ton3* that take the mode 2, mode 3, mode 5, and mode 6 periods into consideration, in an on-state period of the drive target semiconductor element 6. FIG. 13A, FIG. 13B, and FIG. 13C are block diagrams representing a generation of drive signals to the positive electrode side driver switch 3 (Q1), the negative electrode side driver switch 4 (Q2), the positive electrode side recovery switch 81 (Q3), and the negative electrode side recovery switch 91 (Q4) from Ton*, Ton2*, and Ton3*. FIG. 14 is a waveform diagram that illustrates the generation processes of the block diagrams shown in FIG. 13A, FIG. 13B, and FIG. 13C.

FIG. 12A and FIG. 12B show configurations of generating the duty command value Ton2* and the duty command value Ton3* needed in order to generate the periods of mode 2, mode 3, mode 5, and mode 6. In FIG. 12A, it is shown that Ton2* is generated by Tr2/2 being added to Ton* using an adder 21. Also, in FIG. 12B, it is shown that Ton3* is generated by Tr2/2 being subtracted from Ton* using a subtractor 22.

FIG. 13A, FIG. 13B, and FIG. 13C are block diagrams showing, with a triangular wave TW as a carrier waveform, a generation of gate signals, those being a first drive signal Q1, a second drive signal Q2, a third drive signal Q3, and a fourth drive signal Q4, from the triangular wave TW and the duty command values Ton*, Ton2*, and Ton3*.

Firstly, as shown in FIG. 13A, the first drive signal Q1 is generated by the triangular wave TW and the duty command value Ton2* being input into a comparator 23. According to the waveform diagram shown in FIG. 24, a period is shorter than Ton*1 by the total Tr2. In this embodiment, however, mode 2 and mode 6 are on-state periods, as previously described, because of which, according to Expression 21, the on-state period TON is equivalent to Ton*1. Also, as shown in FIG. 13B, the second drive signal Q2 is generated by the triangular wave TW and the duty command value Ton3* being input into a comparator 24. According to the waveform diagram of FIG. 14, an off-state period is also shorter than Ton1* by Tr2.

Regarding an on-state period of the third drive signal Q3, that is, mode 2 and mode 6, the third drive signal Q3 is generated by a command value 26 computed by the duty command value Ton2* and the triangular wave TW being input into a comparator 25 and a command value 28 computed by the triangular wave TW and Ton* being input into a comparator 27 being input into an AND circuit 29, as shown in FIG. 13B. According to the waveform diagram of FIG. 14, the duty command value Ton2* is a duty command value such that time is extended by Tr2 from Ton*, and the on-state period Tr2/2 of the third drive signal Q3 is calculated by the difference between Ton2* and Ton* being computed in the comparator 25, the comparator 27, and the AND circuit 29.

Regarding an on-state period of the fourth drive signal Q4, that is, mode 3 and mode 5, the fourth drive signal Q4 is generated by a command value 31 computed by the duty command value Ton* and the triangular wave TW being input, into a comparator 30 and a command value 33 computed by the triangular wave TW and the duty command value Ton3* being input into a comparator 32 being input into an AND circuit 34, as shown in FIG. 13C. According to the waveform diagram of FIG. 14, the duty command value Ton3* is a duty command value such that time is reduced by Tr2 from Ton*, and the on-state period Tr3/2 of the fourth drive signal Q4 is calculated by the difference between Ton3* and Ton* being computed in the comparator 30, the comparator 32, and the AND circuit 34.

In this way, this embodiment is such that, using the positive electrode side recovery circuit 8 and the negative electrode side recovery circuit 9, the Vciss voltage is increased or reduced in a period between a turning on and a turning off of the drive target semiconductor element 6 by a resonance phenomenon using the input capacitance 7 and the positive electrode side reactor 82, or the input capacitance 7 and the negative electrode side reactor 92, whereby gate power supplied from the positive electrode side gate power supply 1 and the negative electrode side gate power supply 2 is restricted. Because of this, a reduction in size of the gate power supply can be realized.

Also, in this embodiment, the voltage of the positive electrode side gate power supply 1 and the voltage of the negative electrode side gate power supply 2 can be set to differing values, and VdcH and VdcL can be set to drive voltages that can ensure performance and reliability of the drive target semiconductor element 6. Because of this, an improvement of switching characteristics and a prevention of malfunction when turning off can be realized, and gate power supply reliability increases. This is particularly useful when clamping voltage on the negative side when turning off, and in improving switching characteristics, in an element whose positive side rated voltage and negative side rated voltage differ, as is the case with a wide bandgap semiconductor element.

Also, in this embodiment, a period in which a resonance action is carried out can be set arbitrarily as a resonance cycle, and furthermore, a period in which a resonance action is carried out corresponds to a dead time period. Consequently, by the dead time period and the resonance cycle being equal, a restriction of the gate power supply capacitance is realized without changing the on-state period of the drive target semiconductor element 6.

Also, in this embodiment, circuit constants of the positive electrode side recovery circuit 8 and the negative electrode side recovery circuit 9 and the resonance cycle are equal, whereby charging and discharge amounts of the positive electrode side tank capacitor 83 and the negative electrode side tank capacitor 93 are routinely equal. Because of this, VCH and VCL converge at a certain value, because of which no external power supply is needed, and a reduction in size of the overall gate power supply is realized.

Herein, a common gate driver that outputs VdcH and VdcL to the input capacitance 7 of the drive target semiconductor element 6, with a half-bridge inverter configuration using the positive electrode side gate power supply 1, the negative electrode side gate power supply 2, the positive electrode side driver switch 3, and the negative electrode side driver switch 4, is shown in this embodiment, but a full-bridge inverter configuration may also be adopted. In this case, VdcH and VdcL are a common voltage.

Third Embodiment

A principle of a gate power recovery operation when the voltages VCH and VCL of the positive electrode side tank capacitor 83 and the negative electrode side tank capacitor 93 shown in FIG. 4 converge sufficiently has been described in the second embodiment, but in a third embodiment, an initial charging operation of the positive electrode side tank capacitor 83 and the negative electrode side tank capacitor 93 when starting up, that is, when VCH=VCL=0, will be described.

In the third embodiment, a circuit configuration diagram is the same as FIG. 4. Also, a routine operating principle is the same as in the second embodiment, and periods of operating modes, that is, mode 1, mode 2, mode 3, mode 4, mode 5, and mode 6, in a steady state are also in accordance with the second embodiment. That is, the third embodiment describes an operation when starting up of a gate drive circuit including the circuit configuration of FIG. 4 and the drive system shown in the block diagrams of FIG. 12A, FIG. 12B, FIG. 13A, FIG. 13B, and FIG. 13C.

When starting up in a state wherein VCH=VCL=0 in the configuration of FIG. 4, the gate voltage Vciss attempts to change from VdcH to −VdcH, centered on VcH=0, in the mode 2 period defined in FIG. 5, but is clamped at −VdcL due to an effect of a body diode incorporated in the negative electrode side driver switch. The negative electrode side driver switch has a function of clamping a negative polarity side overvoltage of the gate voltage Vciss at −VdcL.

The gate voltage Vciss of mode 2 shifts to mode 3 in the state of −VdcL. In this case, the gate voltage Vciss<VCL, because of which a resonance current flows from the negative electrode side tank capacitor 93 toward the input capacitance 7 in the negative electrode side recovery circuit 9, and Vciss increases from −VdcL to VdcL, centered on VCL=0. At this time, when the turn-on threshold voltage Vth of the drive target semiconductor element 6 is exceeded, the drive target semiconductor element 6 is turned on in mode 3. As mode 3 is a period in which an on-state switches to an off-state, the turn-on operation is a malfunction. For example, in a case in which a leg is configured by two of the drive target semiconductor element 6 being connected in series, the elements forming the pair of drive target semiconductor elements 6 being already turned on in mode 3 leads to concern that an arm short-circuit will be caused, whereby the gate circuit or the drive target semiconductor element will be damaged, and reliability will decrease.

Meanwhile, an operation of switching from an off-state to an on-state is also such that a turning off occurs due to a malfunction. In mode 4, Vciss shifts to mode 4 in a state of −VdcL. In this case, the gate voltage Vciss<VCL, and the gate voltage Vciss increases from −VdcL to VdcL, centered on VCL=0, as described in the first embodiment.

Next, Vciss shifts to mode 6 in a state wherein the gate voltage Vciss=VdcL, and VCH=0. In this case, the gate voltage Vciss>VCH=0, because of which the gate voltage Vciss decreases from VdcL to −VdcL, centered on VCH=0. As Vth>−VdcL, the drive target semiconductor element 6 is turned off.

As mode 6 is a mode in which an on-state operation is continued, the turn-off operation of the drive target semiconductor element 6 is a malfunction. In the third embodiment, in order to prevent the malfunction, an initial charging is carried out so that VCH=VdcH only in the positive electrode side tank capacitor 83. The initial charging is not carried out in the negative electrode side tank capacitor 93.

An initial charging operation with respect to VCH will be described using an operations chart shown in FIG. 15. In FIG. 15, it is assumed that an off state is maintained when on standby. That is, it is assumed that the negative electrode side driver switch 4 (Q4) continues to be in an on-state, and an initial charging operation when starting up is carried out when the drive target semiconductor element 6 is first turned on after starting up. A time at which the turn-on operation is started is taken to be 0 in FIG. 15, an initial charging time is taken to be tc, and a definition of time from the time tc onward, a definition of a mode, and an operating principle are all the same as in the second embodiment. Periods until the time 0 and from 0 to tc are the subject of this embodiment.

Until the time 0, the negative electrode side driver switch 4 (Q2) is in an on-state, and the drive target semiconductor element 6 continues to be in an off-state.

Simultaneously with the positive electrode side driver switch 3 (Q1) being turned on at the time 0, the positive electrode side recovery switch 81 (Q3) is turned on for a tc period. The negative electrode side driver switch 4 (Q4) and the negative electrode side recovery switch 91 (Q4) continue to be in an off-state. In this case, two current paths are created, as shown by dotted arrows in FIG. 16, and power is transmitted from the positive electrode side gate power supply 1 to the positive electrode side tank capacitor 83 along one current path. The positive electrode side tank capacitor 83 undergoes a charging operation owing to the current path, and the voltage value VCH of the positive electrode side tank capacitor 83 rises. A secondary resonance model converging at VdcH is formed in the current path, while resonating between the positive electrode side reactor 82 and the positive electrode side tank capacitor 83.

An attenuating resistance component is envisaged to be on-state resistance of the positive electrode side driver switch 3 and the positive electrode side recovery switch 81, path conduction resistance, or the like. In this case, the voltage value VCH of the positive electrode side tank capacitor 83 undergoes a change expressed in Expression 23. Resonance frequencies are shown in Expression 24, and a resonance cycle is shown in Expression 25.

[Math. 23]

$$V_{CH}=V_{dCH}-V_{dCH}\cos(\omega r \cdot t) \tag{23}$$

[Math. 24]

$$\omega r=1/\sqrt{(LH \cdot CH)} \tag{24}$$

[Math. 25]

$$Tr=2\pi\sqrt{(LH \cdot CH)} \tag{25}$$

According to Expression 22, there is concern that the voltage value VCH of the positive electrode side tank capacitor 83 will transiently rise to 2VdcH, because of which tc is set to a ¼ period of a resonance cycle Tr shown in Expression 25, and an initial charging period of VCH is set to VdcH.

[Math. 26]

$$t_c=\pi/2 \times \sqrt{(LH \cdot CH)} \tag{26}$$

Figure 16:
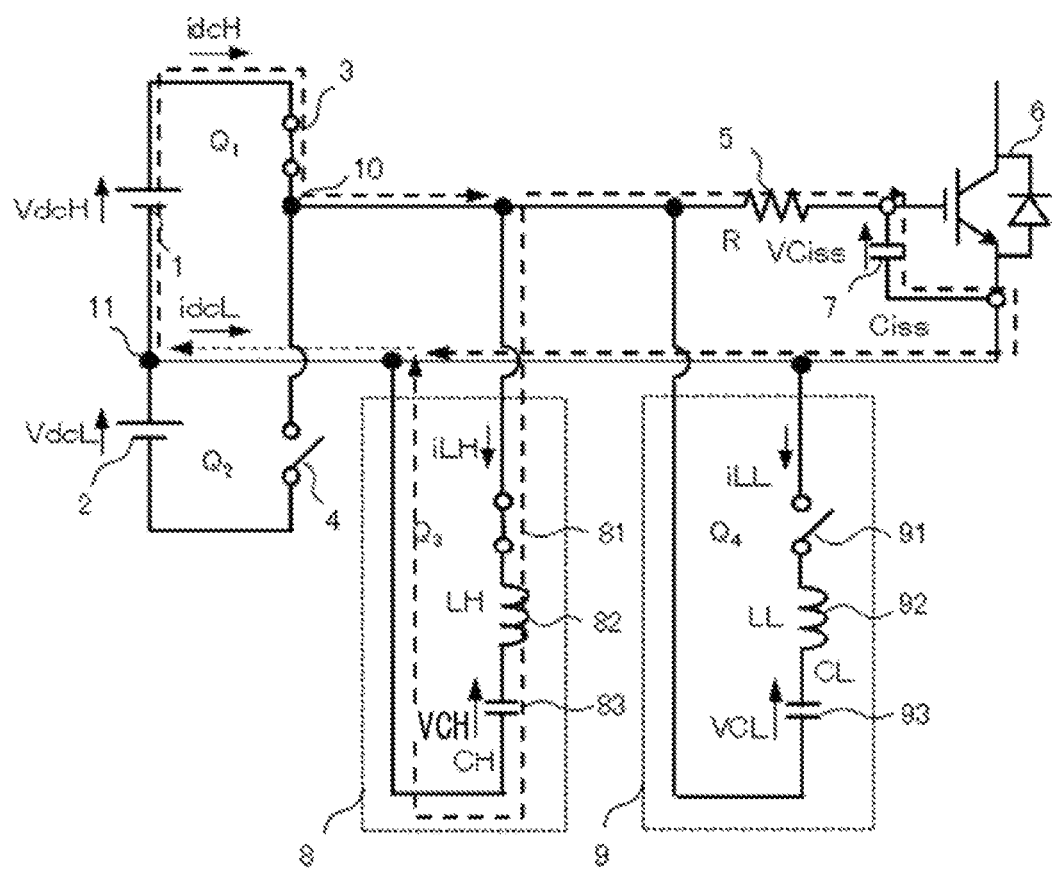
FIG. 16 is an operating principle diagram according to the third embodiment of the invention.

The other current path shown in FIG. 16 shows that power is transmitted from the positive electrode side gate power supply 1 via the gate resistance 5 to the input capacitance 7. Consequently, the gate voltage Vciss changes from −VdcL to VdcH, and is clamped at VdcH.

The positive electrode side recovery switch 81 (Q3) is turned off at the time tc. Thereafter, the gate circuit operates on the same operating principle as in the first embodiment.

In the third embodiment, initial charging of the negative electrode side tank capacitor 93 is not carried out. According to the operating principle described in the second embodiment, the resonance operations of mode 2, mode 3, mode 5, and mode 6 are carried out in accordance with the principle, as VCL satisfies the inequality of the following expression, and turning on and turning off of the drive target semiconductor element 6 are appropriately controlled.

When the voltage value VCH increases from 0 to VdcH owing to the initial charging operation of the positive electrode side tank capacitor 83 described in this embodiment, VCL satisfies Expression 27. Therefore, no initial charging needs to be carried out with respect to VCL.

[Math. 27]

$$-V_{dCL}<V_{CL}<V_{CH} \tag{27}$$

Figure 17:
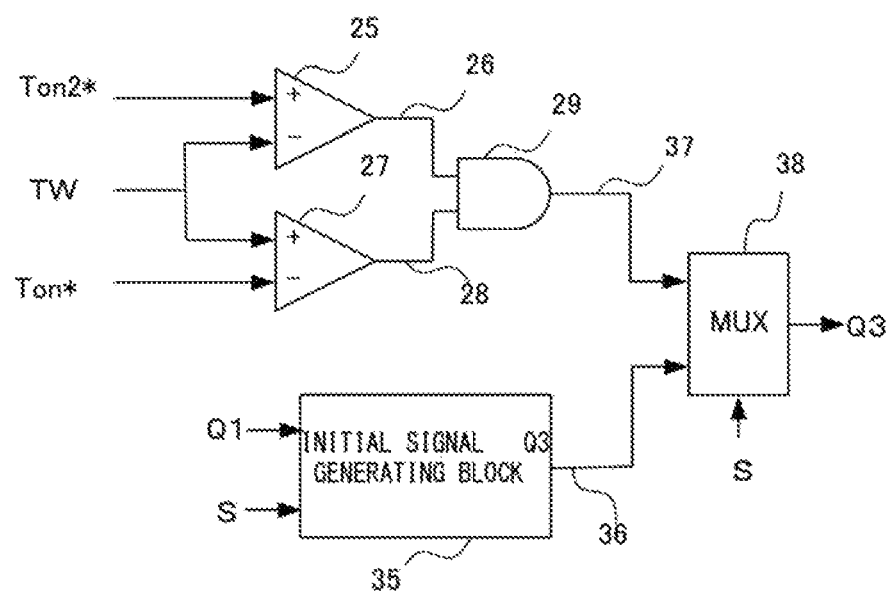
FIG. 17 is a block diagram of a drive signal generation according to the third embodiment of the invention.

FIG. 17 is a block diagram of a generation of a drive signal to the positive electrode side recovery switch 81 (Q3). A routine drive signal generating system is equivalent to that in the second embodiment, and a gate signal 37 is applicable. A signal when starting up is such that when a start-up signal S and the first drive signal Q1 of the positive electrode side driver switch 3 (Q1) are input into a Q3 initial signal generating block 35, a start-up signal 36 is generated in synchrony with the first drive signal Q1 and output at a high level for the tc period. Further, the previously mentioned routine gate signal 37 and the start-up signal S36 are assigned to a selector 38. When an input of the start-up signal S is confirmed in the selector 38 based on the start-up signal S, the start-up signal S36 is output as the third drive signal Q3 a first time only, and from a second time onward, the gate signal 37 is output as the third drive signal Q3 every time.

In this way, the third embodiment is such that when starting up by turning on the positive electrode side driver switch 3 from an initial state wherein the voltage value VCH=VCL=0, the positive electrode side recovery switch 81 is turned on once only tor the tc period in synchrony with the turn-on rise of the positive electrode side driver switch 3, whereby the positive electrode side tank capacitor 83 is initially charged with the voltage value VCH (=VdcH). Because of this, a malfunction of the drive target semiconductor element 6 occurring when the positive electrode side tank capacitor 83 is such that the voltage value VCH=0 is prevented, and reliability of the whole gate circuit including the drive target semiconductor element 6 can be increased.

Fourth Embodiment

The gate drive circuit of the invention has been described in the first to third embodiments. In a fourth embodiment, an example wherein the gate drive circuit of the invention is applied to a power converting device will be described. Herein, the description will be given taking an inverter circuit as an example of a power converting device.

Figure 18:
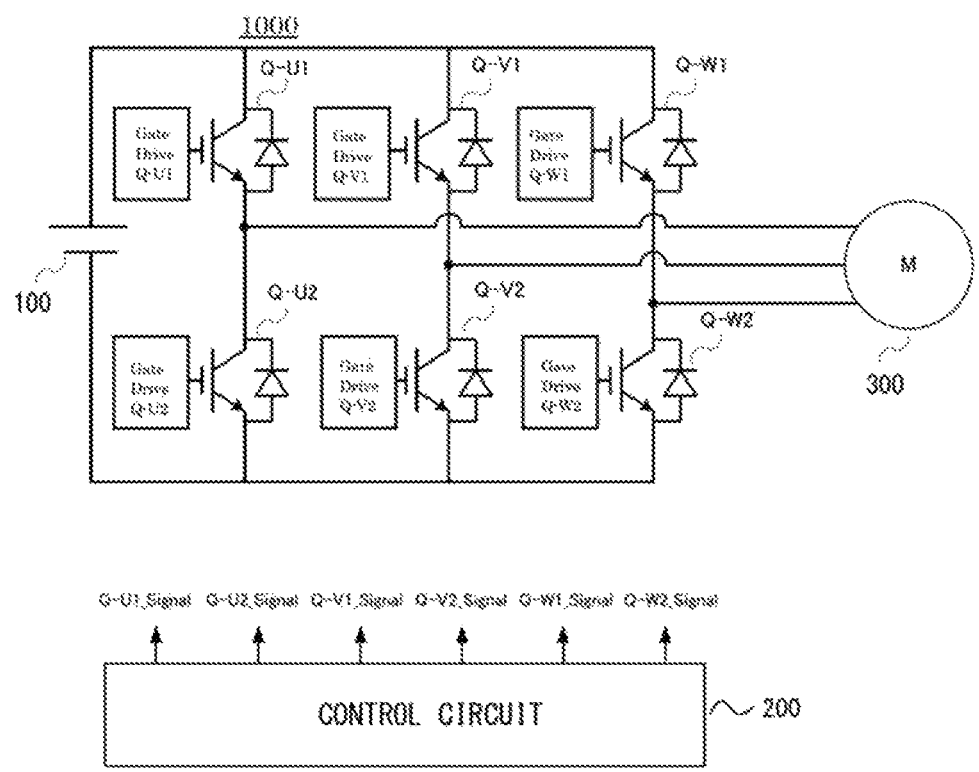
FIG. 18 is a configuration diagram showing a specific example of an inverter circuit according to a fourth embodiment of the invention.

FIG. 18 shows an inverter circuit 1000 according to the fourth embodiment. In FIG. 18, the inverter circuit 1000 is configured of a U-phase leg configured of Q-U1 and Q-U2, a V-phase leg configured of Q-V1 and Q-V2, a W-phase leg configured of Q-W1 and Q-W2, and a control circuit 200, converts power of a direct current power supply 100 into alternating current power, and transmits the alternating current power to an alternating current load 300. Although a motor is shown as an example in FIG. 18, this may equally well be another load.

Herein, a switching element in the inverter circuit 1000 is a voltage-driven semiconductor switching element (a drive target semiconductor element), and carries out turn-on and turn-off operations in accordance with voltage applied by a gate drive circuit. As the gate drive circuit is of the same configuration as that of the gate drive circuit shown in FIG. 4, a description will be omitted.

Next, an operation will be described. The inverter circuit 1000 is such that the gate drive circuit operates based on drive signals (Q-U1Signal, Q-U2Signal, Q-V1Signal, Q-V2Signal, Q-W1Signal, and Q-W2Signal) output from the control circuit 200, whereby the switching element in the inverter circuit 1000 is caused to carry out turn-on and turn-off operations, driving the motor 300. The inverter circuit 1000 shown here is a common inverter circuit, and an existing inverter circuit control method (for example, the kind of control method described in JP-A-2010-154582) can be applied for an operation of the inverter circuit 1000. As an operation of each gate drive circuit that receives a drive signal from the control circuit 200 is the same as that shown in the first embodiment, a description will be omitted. The switching element is driven by voltage output by the gate drive circuit, and operates as an inverter circuit.

Figure 6:
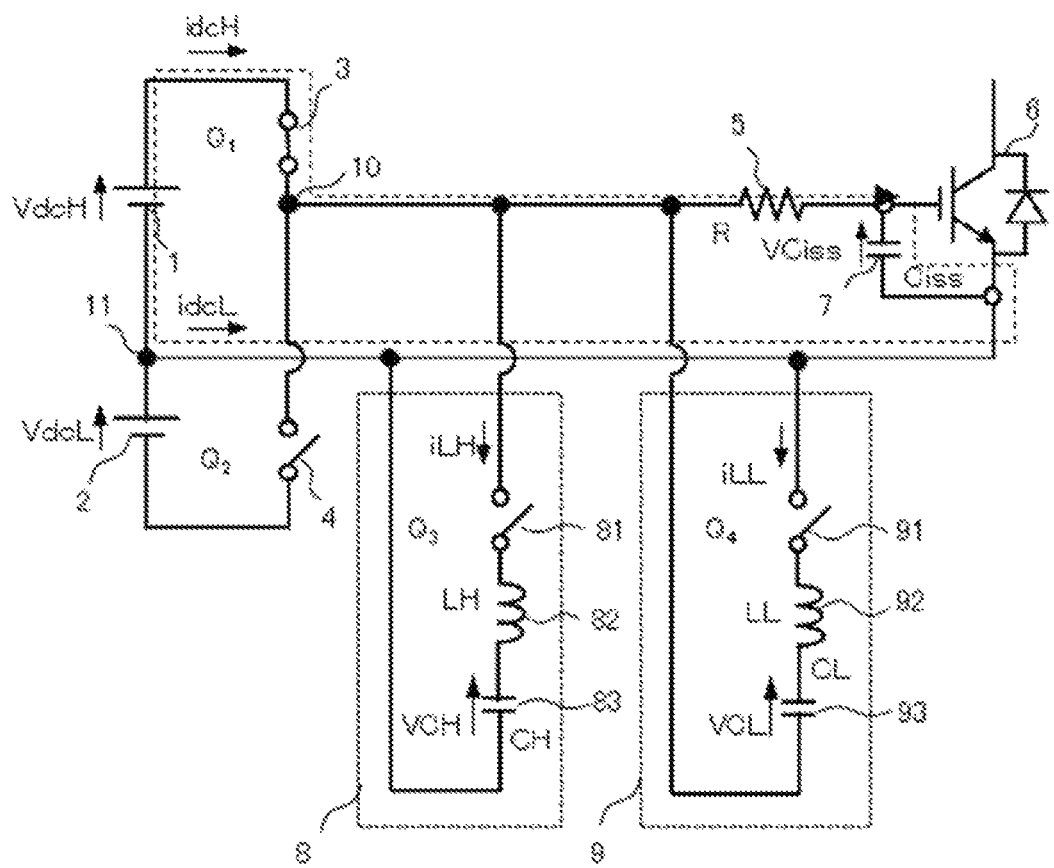
FIG. 6 is an operating principle diagram according to the second embodiment of the invention.
Figure 7:
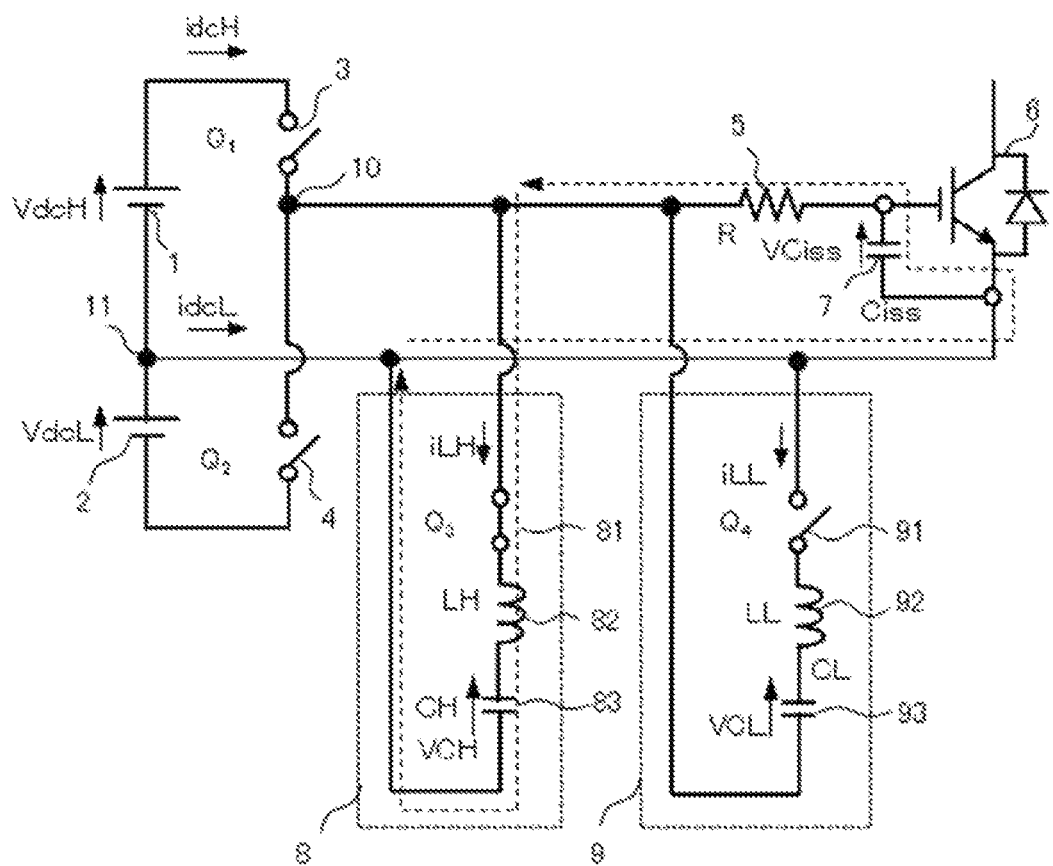
FIG. 7 is an operating principle diagram according to the second embodiment of the invention.
Figure 8:
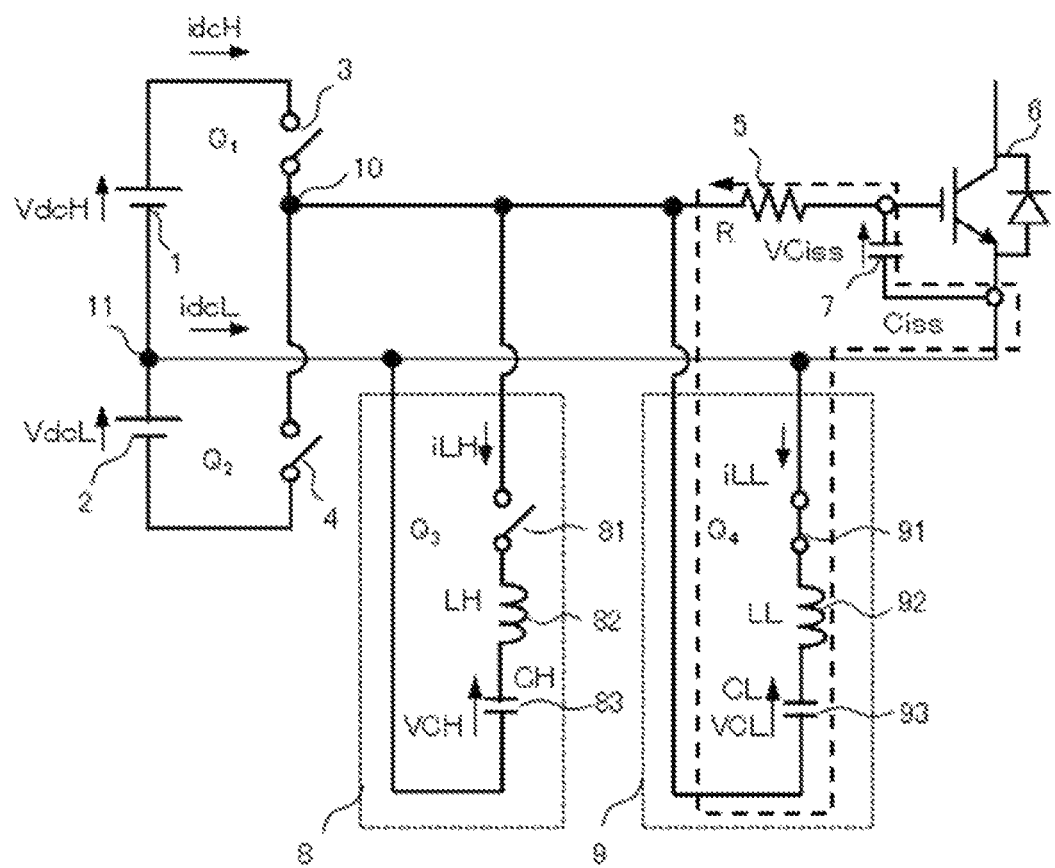
FIG. 8 is an operating principle diagram according to the second embodiment of the invention.
Figure 9:
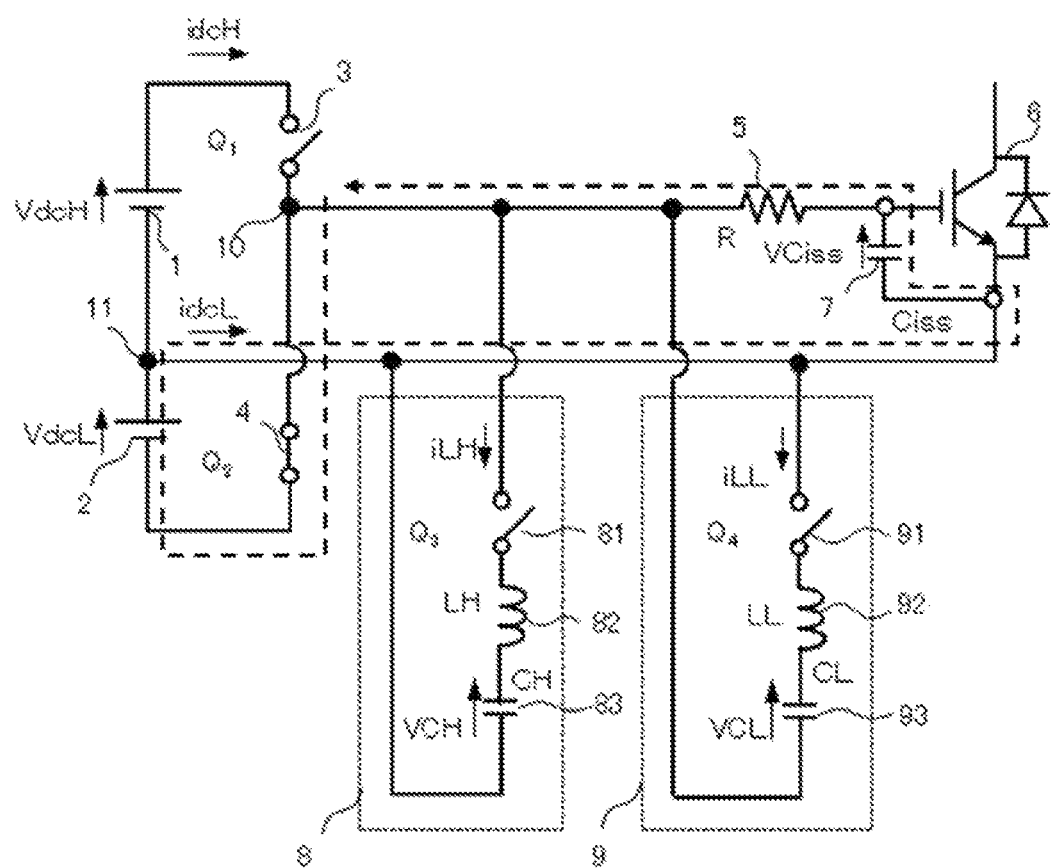
FIG. 9 is an operating principle diagram according to the second embodiment of the invention.
Figure 10:
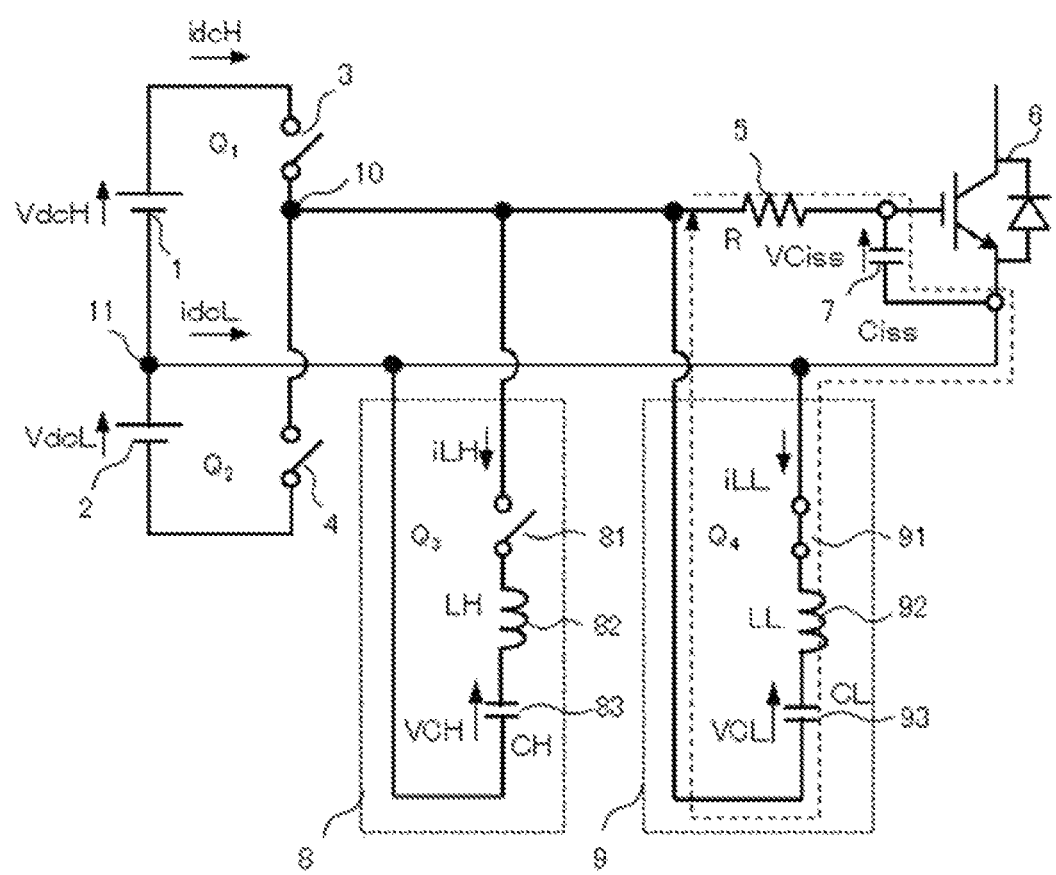
FIG. 10 is an operating principle diagram according to the second embodiment of the invention.
Figure 11:
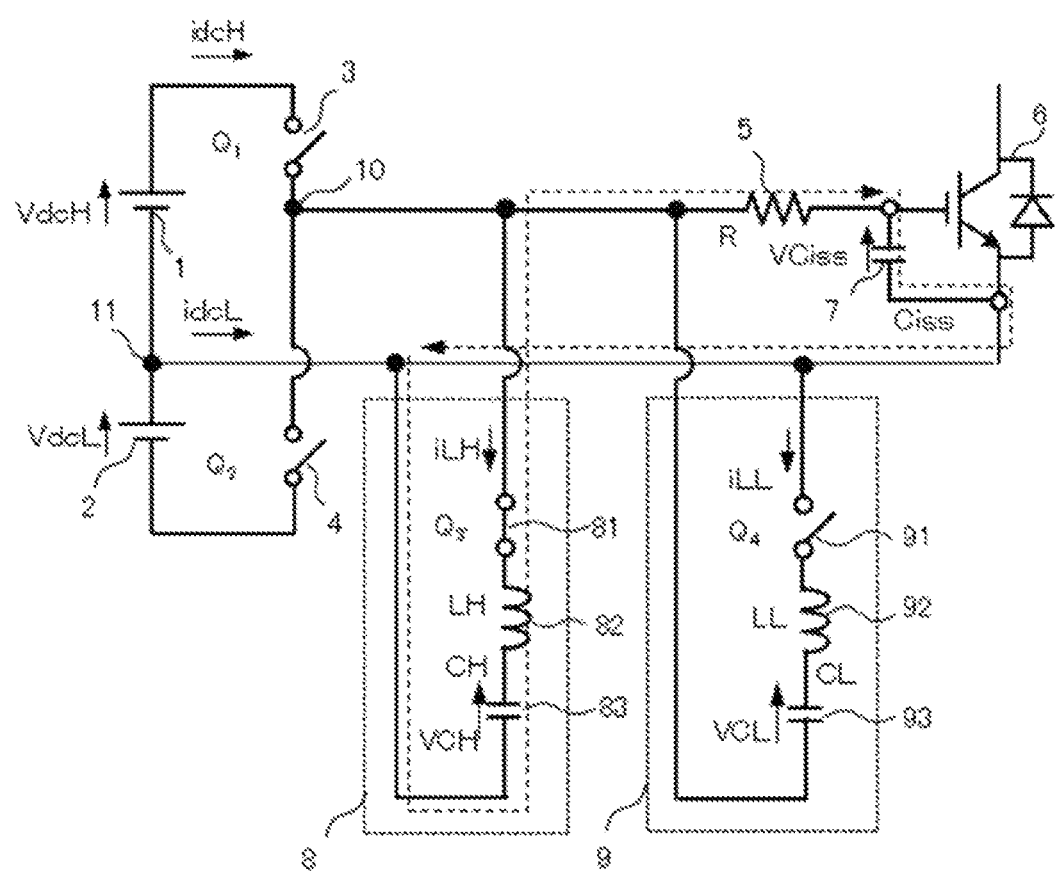
FIG. 11 is an operating principle diagram according to the second embodiment of the invention.

A case wherein the gate drive circuit shown in FIG. 4 is used as the gate drive circuit is shown here, but it goes without saying that the gate drive circuit shown in FIG. 6 may also be used.

Also, the inverter circuit 1000 is shown as one example of a power converting device, but this not being limiting, any kind of power converting device may be adopted, provided that the power converting device carries out a driving on and off in accordance with a gate drive circuit.

Figure 19:
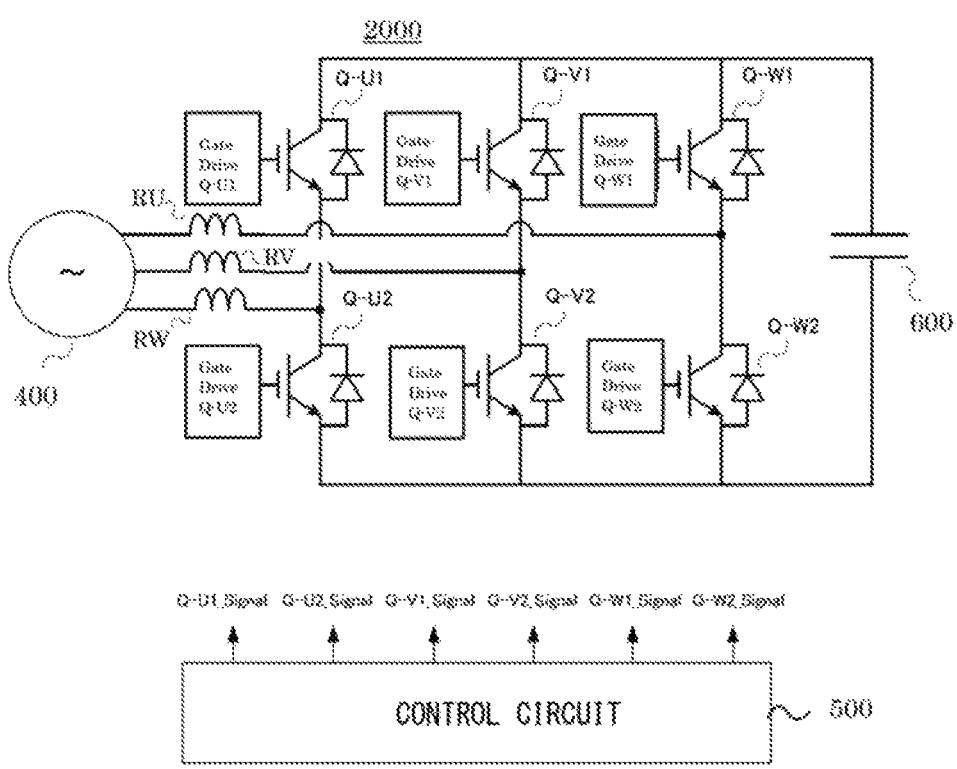
FIG. 19 is a configuration diagram showing a specific example of a converter circuit according to the fourth embodiment of the invention.

For example, the gate drive circuit may be mounted in a kind of converter circuit 2000 shown in FIG. 19 that converts alternating current voltage of an alternating current power supply 400 into direct current voltage, and controls current of the alternating current power supply 400 to a high power factor.

In FIG. 19, the converter circuit 2000 is configured of a U-phase leg configured of Q-U1 and Q-U2, a V-phase leg configured of Q-V1 and Q-V2, a W-phase leg configured of Q-W1 and Q-W2, a U-phase reactor RU, a V-phase reactor RV, a W-phase reactor RW, and a control circuit 500.

Next, an operation will be described. The converter circuit 2000 is such that the gate drive circuit operates based on drive signals output from the control circuit 500, whereby a switching element in the converter circuit 2000 is caused to carry out turn-on and turn-off operations, voltage applied to the reactor U, the reactor V, and the reactor W is rectified, current of the alternating current power supply 400 is controlled to a high power factor, and power of the alternating current power supply 400 is converted to direct current power and transmitted to a direct current load 600.

An existing inverter circuit control method (for example, the kind of control method described in JP-A-WO2015/045485) can be applied for the operation. Also, as an operation of each gate drive circuit that receives a drive signal from the control circuit 500 is the same as that shown in the first embodiment, in the same way as with the inverter circuit, the operation is a general operation, because of which a description will be omitted.

Figure 20:
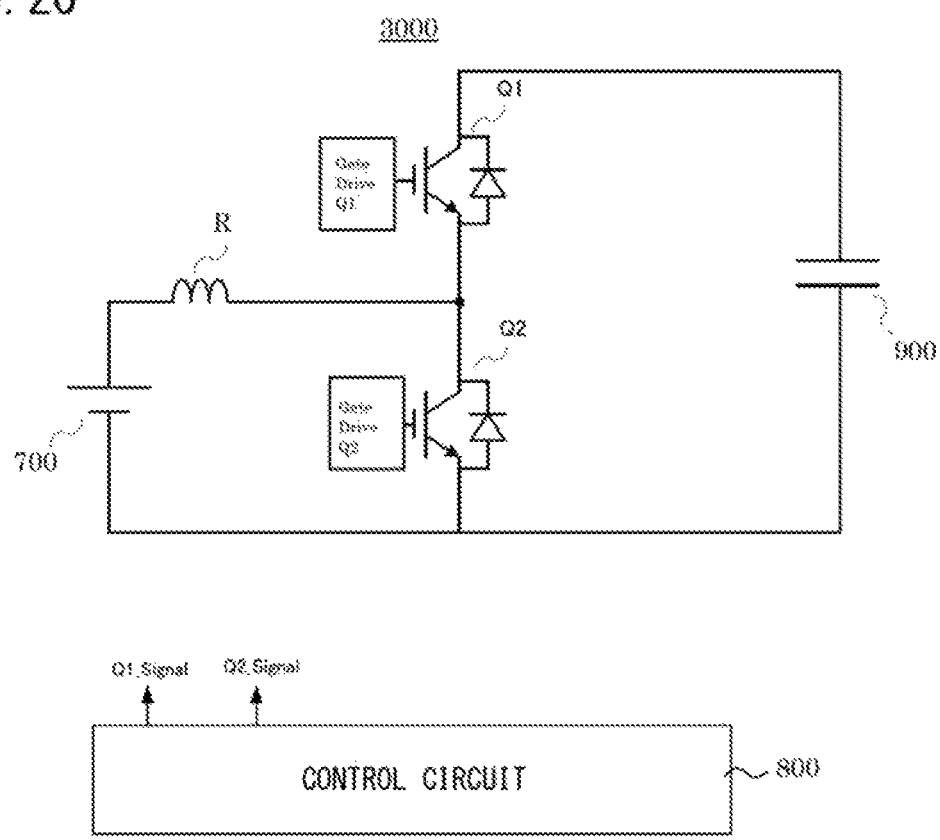
FIG. 20 is a configuration diagram showing a specific example of a chopper circuit according to the fourth embodiment of the invention.

Also, as shown in FIG. 20, the gate drive circuit may also be mounted in a chopper circuit 3000 that converts direct current voltage of a direct current power supply 700 into direct current voltage of a different value.

In FIG. 20, the chopper circuit 3000 is configured of a leg configured of Q1 and Q2, a reactor R, and a control circuit 800.

Next, an operation will be described. The chopper circuit 3000 is such that the gate drive circuit operates based on drive signals output from the control circuit 800, whereby a switching element in the chopper circuit 3000 is caused to carry out turn-on and turn-off operations, voltage applied to the reactor R is rectified, and power of a stepped-up voltage is transmitted from the direct current power supply 700 to a direct current load 900.

An existing chopper circuit control method (for example, the kind of control method described in WO2016/075996) can be applied for the operation. Also, as an operation of each gate drive circuit that receives a drive signal from the control circuit 800 is the same as that shown in the first embodiment, in the same way as with the inverter circuit, the operation is a general operation, because of which a description will be omitted.

A step-up chopper circuit is shown as one example in FIG. 20, but a step-down chopper, a step-up/step-down chopper circuit, or the like, may also be adopted.

Arbitrary components of the embodiments can be freely changed or abbreviated as appropriate, without departing from the scope of the invention.

The invention claimed is:
1. A gate drive circuit, comprising:
 a drive-on element that includes a positive electrode side driver switch and applies an on-state voltage to a gate of a drive target semiconductor element by turning on the positive electrode side driver switch; and
 a drive-off element that includes a negative electrode side driver switch and applies an off-state voltage to the gate of the drive target semiconductor element by turning on the negative electrode side driver switch; wherein a recovery circuit including a positive electrode side recovery circuit and a negative electrode side recovery circuit that are in parallel with each other and connected between output terminals of the gate drive circuit, the positive electrode side recovery circuit including a positive electrode side recovery switch, a positive electrode side reactor, and a positive electrode side capacitor which are all connected in series with each other within the positive electrode side recovery circuit and the negative electrode side recovery circuit including a negative electrode side recovery switch, a negative electrode side reactor, and a negative electrode side capacitor which are all connected in series with each other within the negative electrode side recovery circuit, the gate drive circuit further comprises a control circuit that controls the drive-on element, the drive-off element, the positive electrode side recovery switch, and the negative electrode side recovery switch, and a charge accumulated in input capacitance of the drive target semiconductor element can be recovered when the drive target semiconductor element is turned on or turned off.

2. The gate drive circuit according to claim 1, wherein the gate drive circuit is a half-bridge inverter gate drive circuit configured of a positive electrode side driver switch, a negative electrode side driver switch, a positive electrode side gate power supply, and a negative electrode side gate power supply, the recovery circuit is connected in parallel between the output terminals of the half-bridge inverter gate drive circuit, and the control circuit, in order to turn on the drive target semiconductor element, turns off the negative electrode side driver switch, then turns on the negative electrode side recovery switch for a certain period, turns on the positive electrode side recovery switch for a certain period, and turns on the positive electrode side driver switch, thereby maintaining an on-state of the drive target semiconductor element, and in order to turn off the drive target semiconductor element, the control circuit turns off the positive electrode side driver switch, then turns on the positive electrode side recovery switch for a certain period, turns on the negative electrode side recovery switch for a certain period, and turns on the negative electrode side driver switch, thereby maintaining an off-state of the drive target semiconductor element.

3. The gate drive circuit according to claim 2, wherein control by the control circuit is carried out so that when turning on the drive target semiconductor element, a timing at which the negative electrode side driver switch is turned off and a timing at which the negative electrode side recovery switch is turned on are synchronized, a timing at which the negative electrode side recovery switch is turned off and a timing at which the positive electrode side recovery switch is turned on are synchronized, and a timing at which the positive electrode side recovery switch is turned off and a timing at which the negative electrode side driver switch is turned on are synchronized.

4. The gate drive circuit according to claim 2, wherein control by the control circuit is carried out so that when turning off the drive target semiconductor element, a timing at which the positive electrode side driver switch is turned off and a timing at which the positive electrode side recovery switch is turned on are synchronized, a timing at which the positive electrode side recovery switch is turned off and a timing at which the negative electrode side recovery switch is turned on are synchronized, and a timing at which the negative electrode side recovery switch is turned off and a timing at which the positive electrode side driver switch is turned on are synchronized.

5. The gate drive circuit according to claim 2, wherein a period for which the positive electrode side recovery switch is in an on-state and a period for which the negative electrode side recovery switch is in an on-state are equal.

6. The gate drive circuit according to claim 2, wherein a period for which the positive electrode side recovery switch is in an on-state is one-half of a resonance cycle fixed by the input capacitance of the drive target semiconductor element and the positive electrode side reactor, and the period for which the negative electrode side recovery switch is in an on-state is one-half of a resonance cycle fixed by the input capacitance of the drive target semiconductor element and the negative electrode side reactor.

7. The gate drive circuit according to claim 2, wherein, when starting up the gate drive circuit, the positive electrode side driver switch and the positive electrode side recovery switch are simultaneously turned on for said certain period, the negative electrode side driver switch and the negative electrode side recovery switch are turned off, and an initial charging is carried out from the positive electrode side gate power supply to the positive electrode side capacitor.

8. The gate drive circuit according to claim 7, wherein a period for which the positive electrode side driver switch and the positive electrode side recovery switch are simultaneously in an on-state is one-quarter of a resonance cycle determined by the positive electrode side reactor and the input capacitance of the drive target semiconductor element.

9. The gate drive circuit according to claim 2, wherein a first voltage of the positive electrode side gate power supply and a second voltage of the negative electrode side gate power supply are set to different electric potentials.

10. The gate drive circuit according to claim 2, wherein, with a triangular wave as a carrier waveform, an on-state period of the positive electrode side driver switch is determined by a duty command value that is a duty corresponding to an on-state period of the positive electrode side recovery circuit deducted from an input on-duty being compared with the carrier waveform in the positive electrode side driver switch, and an on-state period of the negative electrode side driver switch is determined by a duty command value that is a duty corresponding to the on-state period of the positive electrode side recovery circuit added to the input on-duty being compared with the carrier waveform in the negative electrode side driver switch.

11. The gate drive circuit according to claim 10, wherein duties corresponding to on-state periods of the positive electrode side recovery circuit and the negative electrode side recovery circuit are equal.

12. The gate drive circuit according to claim 10, wherein the on-state period of the positive electrode side recovery circuit is calculated from a logical sum of a first comparison result output for a period in which, of a duty command value that is the duty corresponding to the on-state period of the positive electrode side recovery circuit added to the input on-duty and the carrier waveform, the duty command value is greater, and a second comparison result output for a second period in which, of the input on-duty and the carrier waveform, the carrier waveform is greater.

13. The gate drive circuit according to claim 10, wherein the on-state period of the negative electrode side recovery circuit is calculated from a logical sum of a first comparison result output for a period in which, of the input on-duty and the carrier waveform, the input on-duty is greater, and a second comparison result output for a second period in which, of a duty command value that is the duty corresponding to the on-state period of the negative electrode side recovery circuit subtracted from the input on-duty and the carrier waveform, the carrier waveform is greater.

14. The gate drive circuit according to claim 1, wherein the drive target semiconductor element is a wide bandgap semiconductor element.

15. A power converting device including a gate drive circuit, including at least one switching element driven by the gate drive circuit, wherein the gate drive circuit is the gate drive circuit according to claim 1.

16. The gate drive circuit according to claim 1, wherein the gate drive circuit is a half-bridge inverter gate drive circuit configured of a positive electrode side driver switch, a negative electrode side driver switch, a positive electrode side gate power supply, and a negative electrode side gate power supply, the recovery circuit is connected in parallel between the output terminals of the half-bridge inverter gate drive circuit.

* * * * *